(12) United States Patent
Bompard et al.

(10) Patent No.: US 12,124,779 B2
(45) Date of Patent: Oct. 22, 2024

(54) METHOD OF NEURAL NETWORK CONSTRUCTION FOR THE SIMULATION OF PHYSICAL SYSTEMS

(71) Applicant: ADAGOS, Ramonville-Saint-Agne (FR)

(72) Inventors: Manuel Bompard, Ramonville (FR); Mathieu Causse, Ramonville (FR); Florent Masmoudi, Ramonville (FR); Mohamed Masmoudi, Ramonville (FR); Houcine Turki, Ramonville (FR)

(73) Assignee: ADAGOS, Ramonville-Saint-Agne (FR)

( * ) Notice: Subject to any disclaimer, the term of this patent is extended or adjusted under 35 U.S.C. 154(b) by 714 days.

(21) Appl. No.: 17/292,305

(22) PCT Filed: Nov. 7, 2019

(86) PCT No.: PCT/FR2019/052649
§ 371 (c)(1),
(2) Date: May 7, 2021

(87) PCT Pub. No.: WO2020/094995
PCT Pub. Date: May 14, 2020

(65) Prior Publication Data
US 2021/0397770 A1   Dec. 23, 2021

(30) Foreign Application Priority Data

Nov. 9, 2018 (FR) ........................................ 1860383
Jan. 23, 2019 (FR) ........................................ 1900572

(51) Int. Cl.
*G06F 30/27* (2020.01)
*G06N 3/04* (2023.01)
*G06N 3/082* (2023.01)

(52) U.S. Cl.
CPC ............... *G06F 30/27* (2020.01); *G06N 3/04* (2013.01); *G06N 3/082* (2013.01)

(58) Field of Classification Search
CPC ........... G06F 30/27; G06N 3/04; G06N 3/082
(Continued)

(56) References Cited

U.S. PATENT DOCUMENTS 5,636,326 A * 6/1997 Stork ................... G01N 33/005
706/25
6,038,389 A * 3/2000 Rahon ..................... G06F 30/23
703/2

(Continued)

OTHER PUBLICATIONS

Arifovic et al. (Using genetic algorithms to select architecture of a feedforward artificial neural network, Physica A 289 (2001) 574-594) (Year: 2001).*

(Continued)

*Primary Examiner* — Iftekhar A Khan
(74) *Attorney, Agent, or Firm* — Seed IP Law Group LLP

(57) ABSTRACT

A method of construction of a feedforward neural network includes a step of initialization of a neural network according to an initial topology, and at least one topological optimization phase, of which each phase includes: an additive phase including a modification of the network topology by adding at least one node and/or a connection link between the input of a node of a layer and the output of a node of any one of the preceding layers, and/or a subtractive phase including a modification of the network topology by removing at least one node and/or a connection link between two layers. Each topology modification includes the selection of a topology modification among several candidate modifications, based on an estimation of the variation in the network error between the previous topology and each topology modified according to a candidate modification.

16 Claims, 9 Drawing Sheets

(58) Field of Classification Search
USPC .......................................................... 703/2
See application file for complete search history.

(56) References Cited

U.S. PATENT DOCUMENTS

| | | | | |
|---|---|---|---|---|
| 7,814,038 | B1* | 10/2010 | Repici | G06N 3/08 706/25 |
| 9,336,483 | B1* | 5/2016 | Abeysooriya | G06N 3/08 |
| 10,614,354 | B2* | 4/2020 | Aydonat | G06N 3/063 |
| 11,158,096 | B1* | 10/2021 | Schubert | G06T 11/001 |
| 11,544,539 | B2* | 1/2023 | Zhang | G06F 17/16 |
| 11,604,957 | B1* | 3/2023 | Schubert | G06N 3/082 |
| 11,616,471 | B2* | 3/2023 | Narayanaswamy | H02S 50/00 307/112 |
| 2014/0067741 | A1* | 3/2014 | Katayama | G06N 3/04 706/27 |
| 2015/0106311 | A1* | 4/2015 | Birdwell | G06N 3/063 706/26 |
| 2018/0307983 | A1* | 10/2018 | Srinivasa | G06N 3/082 |
| 2018/0322388 | A1* | 11/2018 | O'Shea | H04L 1/0033 |
| 2019/0080240 | A1* | 3/2019 | Andoni | G06N 3/086 |
| 2019/0130246 | A1* | 5/2019 | Katayama | G06N 3/045 |
| 2019/0130278 | A1* | 5/2019 | Karras | G06V 10/82 |
| 2019/0171936 | A1* | 6/2019 | Karras | G06N 3/084 |
| 2020/0167659 | A1* | 5/2020 | Moon | G06N 3/084 |
| 2020/0364545 | A1* | 11/2020 | Shattil | G06N 3/08 |
| 2021/0279553 | A1* | 9/2021 | Zhu | G06N 3/105 |
| 2021/0357555 | A1* | 11/2021 | Liu | G06F 30/27 |
| 2021/0390396 | A1* | 12/2021 | Fan | G06N 3/08 |
| 2021/0397770 | A1* | 12/2021 | Bompard | G06N 5/01 |
| 2022/0092240 | A1* | 3/2022 | Chi | G06F 30/23 |

OTHER PUBLICATIONS

Gao et al. (âOrthogonal Least Squares Algorithm for Training Cascade Neural Networksâ, IEEE, 2012, pp. 2629-2637) (Year: 2012).*

Ma et al. (A new strategy for adaptively constructing multilayer feedforward neural networks, Neurocomputing 51 (2003) 361 â385) (Year: 2003).*

Finding Better Topologies for Deep Convolutional Neural Networks by Evolution, 2018, arXiv, pp. 1-10) (Year: 2018).*

Huang et al., "Orthogonal Least Squares Algorithm for Training Cascade Neural Networks," *IEEE Transactions on Circuits and Systems—I: Regular Papers* 59(11):2629-2637, Nov. 2012.

Zhang et al., "Finding Better Topologies for Deep Convolutional Neural Networks by Evolution," arXiv:1809.03242v1, Sep. 10, 2018, 10 pages.

"ADAGOS," Sep. 20, 2018, extracted from the internet on Jan. 13, 2020 from https://web.archive.org/web/20180920073216/https://www.adagos.com/, 3 pages.

Attik et al., "Neural network topology optimization," ICANN '05: Proceedings of the 15th International Conference on Artificial Neural Networks: Formal Models and their Applications—vol. Part II, Sep. 2005, pp. 53-58. (Abstract only).

Balabin et al., "Support vector machine regression (SVR/LS-SVM)—an alternative to neural networks (ANN) for analytical chemistry? Comparison of nonlinear methods on near infrared (NIR) spectroscopy data," *Analysis* 136:1703-1712, 2011.

Bottou, "Large-Scale Machine Learning with Stochastic Gradient Descent," Proceedings of Compstat 2010, 10 pages.

Carlberg et al., "The GNAT method for nonlinear model reduction: effective implementation and application to computational fluid dynamics and turbulent flows," Preprint submitted to *Journal of Computational Physics*, Oct. 29, 2018, 33 pages.

Chinesta et al., "A Short Review on Model Order Reduction Based on Proper Generalized Decomposition," *Archives of Computational Methods in Engineering* 18(4), 10 pages.

Glaessgen et al., "The Digital Twin Paradigm for Future NASA and U.S. Air Force Vehicles," Paper for the 53rd Structures, Structural Dynamics, and Materials Conference: Special Session on the Digital Twin, Apr. 2012, 14 pages.

Lecun et al., "Deep learning," *Nature* 521, May 28, 2015, pp. 436-444.

Lophaven et al., "DACE—A Matlab Kriging Toolbox," IMM—Informatics and Mathematical Modelling, Technical University of Denmark, Technical Report IMM-TR-2002-12, Version 2.0, Aug. 1, 2002, 28 pages.

Mineu et al., "Topology Optimization for Artificial Neural Networks using Differential Evolution," IJCCN 2020 International Joint Conference in Neural Networks, 8 pages.

Nazghelichi et al., "Optimization of an artificial neural network topology using coupled response surface methodology and genetic algorithm for fluidized bed drying," *Computers and Electronics in Agriculture* 75:84-91, 2011.

Tuegel et al., "Reengineering Aircraft Structural Life Prediction Using a Digital Twin," *International Journal of Aerospace Engineering*, Hindawi Publishing Corporation, vol. 2011, Article ID 154798, 14 pages.

* cited by examiner 9　　13　　4　　1　　7　　1　　4　　1

7　　17　　3　　4　　2　　1

METHOD OF NEURAL NETWORK CONSTRUCTION FOR THE SIMULATION OF PHYSICAL SYSTEMS

BACKGROUND

Technical Field

The present disclosure concerns the learning of phenomena representing real systems with parsimonious neural networks having very few connections.

The present disclosure applies in particular to the simulation of a static real system, for example to evaluate the response of the real system in new situations, but also to the simulation of a dynamic real system over long periods of time, for example to model the evolution of a real system. The dynamic model is based on a recurrent form of a feedforward neural network that is called a "recurrent pattern" in the following.

The present disclosure has an advantageous application in the simulation of complex physical systems in at least real time.

Description of the Related Art

The present disclosure proposes a method for the learning of real phenomena by parsimonious neural networks having very few connections. This can concern physical, biological, chemical, or even computer phenomena.

State-of-the-art methods have been largely inspired by the biological brain, which is highly redundant. Redundancy helps protect the brain from the loss of neural cells. This loss may or may not be accidental. It turns out that the choice of redundancy in artificial neural networks plays a major role in the learning process.

The first cause of redundancy is linked to the organization of the neural network's topology into layers of neural cells. It is up to the user to define the number of layers and the number of cells per layer. This construction is done manually in a trial-and-error process. The neural network must be large enough to carry out the learning, but its size is not minimal and is necessarily redundant.

This redundant nature plays a major role in the learning process. Indeed, according to the publication by LeCun, Yann; Bengio, Yoshua; Hinton, Geoffrey (2015), "Deep learning," Nature 521 (7553): 436-444, the learning process is not trapped by the local minima when the neural network is sufficiently large.

This fundamental property makes the gradient descent method a possible candidate for achieving learning. But this method, reputed to have a very low convergence rate (https://en.wikipedia.org/wiki/Gradient_descent), ensures a very good error descent at the start of the learning process. Hence the idea of stochastic gradient descent: Bottou, L (2010), Large-scale machine learning with stochastic gradient descent, in Proceedings of COMPSTAT2010 (pp. 177-186) Physica-Verlag HD, which reinforces this property by changing the error function with each iteration of the gradient. This involves applying an iteration of the gradient to each training sample in turn. Sometimes the stochastic gradient descent method is applied by small groups of samples. Stochastic gradient descent, like gradient descent, does not have good local convergence. The answer to this problem is redundancy. Indeed, due to this redundant nature, the learning process must stop prematurely to avoid the phenomenon of overfitting. The gradient and stochastic gradient descent methods are therefore used only within their area of effectiveness.

Finally, in a redundancy context, the large number of connection weights to be determined requires the use of massive amounts of data. The state of the art goes hand in hand with what is known as "big data."

The state of the art represents a coherent construction based on redundancy. But the absence of local convergence shows that the state of the art is oriented towards qualitative learning. If the answer is greater than 0.5, it is rounded to one, and if it is less than 0.5, it is rounded to 0. Quantitative responses have precision requirements which are not taken into account by these methods.

The present disclosure responds to the requirements of the emerging field of modeling complex physical systems by creating a digital copy, also called a Digital Twin, of the physical system, adapted to accurately predict the state of a physical system more quickly than the real system, and preferably thousands of times faster, so as to be able to simulate a large number of possible scenarios impacting the physical system before making the best decision for the real system.

The Digital Twin concept has been introduced in the following publications:

Glaessgen, E. H. & Stargel, D. (April 2012), "The Digital Twin paradigm for future NASA and US Air Force vehicles," in 53rd Struct. Dyn. Mater. Conf. Special Session: Digital Twin, Honolulu, HI, US.

Tuegel, E. J., Ingraffea, A. R., Eason, T. G. & Spottswood, S. M. (2011), "Reengineering aircraft structural life prediction using a digital twin," International Journal of Aerospace Engineering, 2011.

Most learning methods, when applied to quantitative phenomena, are generally limited to relatively simple cases which require only shallow models. In addition to neural methods, we can cite methods such as kriging and support vector machine regression:

Lophaven, S. N., Nielsen, H. B., & Sondergaard, J. (2002). DACE: a Matlab kriging toolbox (Vol. 2). IMM, Informatics and Mathematical Modeling, The Technical University of Denmark, Balabin, R. M. & Lomakina, E. I. (2011). Support vector machine regression (SVR/LS-SVM)—an alternative to neural networks (ANN) for analytical chemistry? Comparison of nonlinear methods on near infrared (NIR) spectroscopy data. Analyst, 136 (8), 1703-1712.

These two extremely popular methods can be likened to shallow neural networks, having only three layers of neurons.

These methods, as well as neural networks with a low number of layers, cover most requirements in the field of modeling quantitative phenomena.

The need for deep and quantitative learning appears in special cases such as:

Dynamic modeling with recurrent neural networks. A prediction over 1000 time intervals is equivalent to creating a neural network with several thousand layers, Non-linear compression of data by neural networks, where the compression ratio increases considerably with the number of layers of the neural networks.

Although the state of the art is dominated by the manual determination of a neural network's topology, the question arises concerning determination of a topology adapted to the problem. The automatic search for an optimal topology is an old topic of research in the neural field. We can cite for example Attik, M., Bougrain, L., & Alexandre, F. (2005, September), Neural network topology optimization, in *International Conference on Artificial Neural Networks* (pp. 53-58) Springer, Berlin, Heidelberg, which is representative of pruning techniques for simplifying a network.

We can cite other topological optimization methods:

Mineu, N. L., Ludermir, T. B., & Almeida, L. M. (2010, July). Topology optimization for artificial neural networks using differential evolution. In *Neural Networks (IJCNN), The 2010 International Joint Conference on* (pp. 1-7), IEEE.

Nazghelichi, T., Aghbashlo, M., & Kianmehr, M. H. (2011). Optimization of an artificial neural network topology using coupled response surface methodology and genetic algorithm for fluidized bed drying. *Computers and electronics in agriculture*, 75(1), 84-91.

These are based on genetic algorithms. These methods are known to be very slow. Thanks to the computing resources available, these methods are increasingly being used on a redundant database of neural networks.

However, applications also exist for which the amount of available data is very limited (the term "small data" is then used), and in this case the redundant structures of neural networks cannot be used because they require more data than what is available.

Other approaches consist of creating a reduced model by relying on computation-intensive simulation software, which requires hours of calculation and which is not compatible with real time. These approaches consist of creating a space of reduced dimension onto which the parameters of the system are projected. For example, for the case of a dynamic system, by denoting as $X_i$ the solution of a problem not reduced at time i, a solver must, to determine $X_{i+1}$ from $X_i$, solve a system of N equations of the type $F(X_i, X_{i+1})=0$.

The number N is also the dimension of the vectors $X_i$ and $X_{i+1}$. The implementation of a reduced model consists in determining a reduced orthonormal basis which is denoted $U=(U_1, U_2, \ldots, U_n)$ where n<<N. We can therefore compress $X_i$ by: $x_i=U^T X_i$, where the $x_i$ are the coefficients of size n of $X_i$, in the reduced basis U, and we can decompress $x_i$ to obtain $X_i$ as follows: $X_i \approx U x_i$.

The reduced model consists of solving, at each time interval, a system $F(Ux_i, Ux_{i+1})=0$ whose unknown $x_{i+1}$ is of small size n. This system is solved in the least squares sense.

As schematically represented in FIG. 1, once the compressed data $x_{i+1}$ is determined from $x_i$, it is decompressed in order to implement a recursive loop on the real data.

This reduced model approach has been proposed for example in the following publications:

Carlberg, K., Farhat, C., Cortial, J., & Amsallem, D. (2013), The GNAT method for nonlinear model reduction: effective implementation and application to computational fluid dynamics and turbulent flows, Journal of Computational Physics, 242, 623-647, Chinesta, F., Ladeveze, P., & Cueto, E. (2011), A short review on model order reduction based on proper generalized decomposition, Archives of Computational Methods in Engineering, 18(4), 395-404.

This approach is not without disadvantages, however.

First, the reduced problem is highly unstable, which means that a small disturbance in the data leads to a large deviation from the solution. Therefore, approximating the state of a complex physical system with such a model is difficult.

In addition, the minimization of $\|F\|^2$ implies computing a residual, of large dimension N, a certain number of times, which can prove to be costly in computing time. However, because of the instability problem, the residual must be minimized with the greatest precision at each step. As a result, the current methods are insufficiently precise to describe non-linear complex physical systems, and too costly in computing time to be able to be used in real time in embedded systems.

The basic idea of these methods is to extract modeling information from the simulation software through the residual calculation. Our approach is so parsimonious that it manages to capture the physical and biological phenomena conveyed by the data.

Thus there is no currently existing solution that allows accurately and quickly modeling a complex physical system, over long periods of time, in order to reproduce it in the form of a digital twin.

SUMMARY

The present disclosure aims to remedy the shortcomings of the prior art described above, based on the use of redundant neural networks for learning real phenomena representing real systems.

In one or more embodiments, the present disclosure provides a method of dynamic simulation of a complex physical system, provided with excellent prediction capabilities over long periods of time and faster than the real time of the physical system.

In some embodiments, the present disclosure is applicable to both static and dynamic modeling of complex physical systems, and also applicable to the nonlinear compression of complex systems. Indeed, the compression ratio increases drastically with the depth of the network. This compression is the basis of the dynamic prediction over long periods of time.

Lastly, the present disclosure aims to provide a neural network structure adapted to the application which is later made thereof, this structure being parsimonious, in other words as reduced as possible in order to require a small amount of data for its learning.

More particularly, the present disclosure relates to a method of construction of a feedforward neural network, comprising a set of processing nodes and of connections between the nodes forming a topology organized in layers, such that each layer is defined by a set of simultaneously calculable nodes, and the input of a processing node of a layer can be connected to the output of a node of any of the previously calculated layers, the method comprising a step of initialization of a neural network according to an initial topology comprising an input layer, at least one hidden layer comprising at least one node, and a set of output nodes, and at least one topological optimization phase, each topological optimization phase comprising:

at least one additive phase comprising a modification of the network topology by adding at least one node and/or a connection link between the input of a node of a layer and the output of a node of any of the preceding layers, and/or at least one subtractive phase comprising a modification of the network topology by removing at least one node and/or a connection link between two layers, and wherein each topology modification comprises the selection of a topology modification among several candidate modifications, based on an estimation of the variation of the network error, calculated on training data, between the previous topology and each topology modified according to a candidate modification.

Advantageously, but optionally, the selected topology modification is the one, among the candidate modifications, which optimizes the variation of the error in comparison to the previous topology.

In one embodiment, the network error for a given topology is defined by $J(\Gamma, W^*)$ where
- J is an error function between an output datum from the network and a target result,
- $\Gamma$ is the topology of the network, and
- $W^*$ is the matrix of connection weights of the network, minimizing the error function J at fixed topology F.

In one embodiment, the variation of the network error between a candidate topology and the previous topology is estimated by calculating the quantity: $J(\Gamma^n, \tilde{W}^n,) - J(\Gamma^{n-1}, W_{n-1}^*)$ where, abusing the notation, we denote
- $\Gamma^n$ as the topology of the candidate network in iteration n,
- $\tilde{W}^n$ is a matrix of connection weights of the network after at least one iteration of training the network following the candidate topological modification in iteration n, and
- $W^{n-1}*$ is the matrix of connection weights of the network of iteration n−1 minimizing the error function J at fixed topography $\Gamma^{n-1}$.

$\tilde{W}^n$ can then be initialized with the same connection weights as matrix $W^{n-1}*$ for the connections common to the two topologies, and, in the case of an additive phase, a connection weight of zero for each link created during the additive phase.

In one embodiment, the estimation of the variation of the network error between a modified topology and the previous topology comprises the estimation of the network error according to the modified topology based on the Lagrange operator applied to the connection weights of the neural network $\mathcal{L}(\Gamma, W, X, \Lambda)$, where:
- $\mathcal{L}$ is the Lagrange operator,
- $\Gamma$ is the network topology,
- W is a matrix of connection weights of the network,
- $X=(X^0, \ldots, X^{nc})$ represents the outputs of all the nodes of the network and $X^i$ represents the outputs of the nodes of layer i, and
- $\Lambda_i$ is the Lagrange multiplier associated with the expression defining the elements of layer $X^i$.

Advantageously, during an additive phase, the variation of the network error between a candidate topology and the previous topology is estimated by calculating the quantity: $\mathcal{L}(\Gamma^n, W^n, X, \Lambda) - J(\Gamma^{n-1}, W^{n-1}*)$, where:
- $\Gamma^n$ is the topology of the candidate network in iteration n,
- $W^{n-1}*$ is the matrix of connection weights of the network of the topology of iteration n−1 minimizing the error function J for a fixed topography,
- $W^n$ is a matrix of connection weights of the network after the candidate topological modification in iteration n, said matrix being initialized with the same connection weights as matrix $W^{n-1}*$ for the connections that are common to the candidate topology at iteration n and the topology of iteration n−1, and a connection weight of zero for each link created during the additive phase. An update of $W^n$ is then obtained by minimizing $\mathcal{L}$ with respect to the weight of the links created.

Advantageously, during a subtractive phase, the variation of the network error between a calculated topology and the previous topology is estimated by calculating the quantity: $\mathcal{L}(\Gamma^n, W^n, X, \Lambda) - J(\Gamma_{n-1}, W^{n-1}*)$ where $W^n = W_{|\Gamma^n}^{n-1}*$ is a restriction of $W^{n-1}*$ to topology $\Gamma^n$.

In one embodiment, the neural network is adapted to simulate a real system governed by an equation of the type $Y=f(X)$ where X is an input datum and Y is a response of the physical system, and the error J of the neural network is defined as a function of the topology $\Gamma$ and of the matrix W of connection weights of the network, by: $J(\Gamma, W)=\Sigma_{i=1}^{M}\|f_{\Gamma,W}(X_i)-Y_i\|^2$, where $f_{\Gamma,W}(X_i)$ is the output of the neural network, and $X_i$ and $Y_i$ are respectively input and output data generated by measurements on the real system.

In one embodiment, the method comprises, once the topology modification has been selected, the determination of a matrix of connection weights of the network by a method of descending the error with respect to said matrix. This step teaches the network the topology obtained after the topological modification.

Unlike the state of the art, this learning process is based on a Gauss-Newton type of descent method having rapid convergence.

Advantageously, the topological optimization step is implemented as a function of mean errors of the neural network on training data on the one hand, and on validation data on the other hand, wherein:
- at least one additive step is implemented to reduce the error on the training data,
- at least one subtractive step is implemented, if the error on the training data becomes less than the error on the validation data beyond a predetermined tolerance, and
- the topological optimization is stopped when no additive or subtractive step results in a reduction of the error on the training data and on the validation data.

In one embodiment, the neural network comprises at least one compression block suitable for generating compressed data, and a decompression block, the method comprising at least one topological optimization phase implemented on the compression block and decompression block, and further comprising, after topological optimization of the blocks, a learning phase on the entire neural network at fixed topology.

In this case, the initialization step of the neural network comprises:
- creating an initial neural network comprising:
  - an input layer receiving an input $X_i$,
  - an output layer generating an output $X_i$, and
  - a central hidden layer placed between the input layer and the output layer, implementing a training of the initial neural network,
- replacing, in the initial neural network, the central hidden layer by a first intermediate layer, a new central layer, and a second intermediate layer, the intermediate layers being copies of the replaced central layer, and
- defining the compression block as the set of layers between the input layer and the central layer, and the decompression block as the set of layers between the central layer and the output layer.

The method may further comprise the iterative implementation of:
- a step of subdividing the central layer into a new first intermediate layer, a new central layer, and a new second intermediate layer,
- redefining the compression and decompression blocks to include the layers obtained at the end of the subdivision step, and
- topological optimization of the compression and decompression blocks.

In one embodiment, the method further comprises the selection of the compression and decompression block and the addition of a modeling block, respectively as output from the compression block or as input to the decompression block, wherein at least one topological optimization phase is implemented on the modeling block, and a learning phase at fixed topology is implemented on the set comprising the modeling block and the compression or decompression block.

In one embodiment, the method further comprises the insertion, between the compression block and the decompression block, of a modeling block suitable for modeling the evolution of a dynamic system governed by an equation of the form $X_{i+1}=F(X_i, P_i)+G_i$, $i\geq 0$ where $X_i$ is a measurable characteristic of the physical system at a given time, $P_i$ describes the internal state of the physical system, and $G_i$ describes an excitation, and the modeling block is suitable for calculating an output $x_{i+1}$ of the form: $x_{i+1}=h_{\hat{\Gamma},\hat{W}}(x_i, p_i)+g_i$, $i\geq 0$ (17) where:

$x_i$ is a compression of $X_i$ by the compression block $x_i=C_X(X_i)$, $h_{\hat{\Gamma},\hat{W}}$ is the function calculated by the modeling block, $\hat{\Gamma}$ and $\hat{W}$ are respectively the topology and the matrix of connection weights of the modeling block, and $p_k$ and $g_k$ are the data representative of the excitation and of the internal state of the system feeding the modeling block.

The present disclosure also relates to a neural network, characterized in that it is obtained by implementing the method according to the above description.

The present disclosure also relates to a computer program product, comprising code instructions for implementing the method according to the above description, when it is executed by a processor.

The present disclosure also relates to a method of simulation of a real system governed by an equation of type $Y=f(X)$ where $X$ is an input datum and $Y$ is a response of the real system, comprising:

the construction of a neural network suitable for calculating a function $f_{\Gamma,W}$ such that $Y \approx f_{\Gamma,W}(X)$, by implementing the method according to the above description, the neural network possibly comprising a compression block, and the application of the neural network to a new input datum $X_j$, in order to deduce therefrom a simulation of response $Y_j$ of the system.

The present disclosure also relates to a method of simulation of a dynamic physical system governed by an equation of the form $X_{i+1}=F(X_i, P_i)+G_i$, $i\geq 0$ where $X_i$ is a measurable quantity of the physical system at a given time, $P_i$ describes the internal state of the physical system, and $G_i$ describes an excitation, the method comprising the steps of:

acquisition of $X_i$, $P_i$ and $G_i$, compression of $X_i$ to obtain a compressed datum $x_i$, recurrent application, a number k of times, of a neural network modeling the dynamic physical system, on the compressed datum $x_i$ in order to obtain at least one subsequent compressed datum $x_{i+k}$, and decompression of the subsequent compressed datum $x_{i+k}$ in order to obtain a modeling of a subsequent quantity $X_{i+k}$.

In one embodiment, the method of simulation is implemented by means of a neural network constructed according to the method described above and comprising a compression block and a decompression block, and the steps of compression of $X_i$, application of a neural network, and decompression of $x_{i+1}$ are respectively implemented by means of the compression block, the modeling block, and the decompression block of the constructed neural network.

Lastly, the present disclosure relates to a method of data compression, comprising:

the construction, by implementing the method of compression according to the above description, of a neural network comprising a compression block receiving a datum X as input and a decompression block generating the datum X as output, wherein the construction of the neural network comprises the implementation of at least one topological optimization phase on the compression block and decompression block, and the application, to at least one datum representative of the state of a real system, of the compression block of the constructed neural network.

The method of construction of a neural network according to the present disclosure makes it possible to obtain a neural network whose structure depends on the intended use or application, since the construction comprises a topological optimization phase which is governed by the error of the network on the training and validation data.

In other words, the method of construction simultaneously comprises the construction and training of the neural network, for a specific task. This allows a user of this method to have no need of specific mathematical knowledge in order to choose a neural network structure suitable for the targeted technical application.

More particularly, the method of construction according to the present disclosure makes it possible to construct a parsimonious neural network, meaning where any redundancy is eliminated, optimized for the intended task. This property is obtained by an incremental construction from a possibly minimal initial topology, in other words comprising a single hidden layer comprising a single neuron, then by implementing an iterative process comprising a learning step in the current state of the network, using a method of rapid local convergence, such as the Gauss-Newton method, and a step of topological modification of the network in order to improve the learning. In addition, the implementation of a topological optimization technique in the construction plays a double role:

avoiding local minima, where at each (rapid) convergence of the learning process, the technique of additive topological optimization enriches the neural network with the element (node or link) that best improves the learning. Indeed, the state of the art avoids local minima by uncontrolled redundancy and we avoid local minima by enrichment controlled by the topological gradient.

creating a parsimonious neural network, and in particular reducing its depth in order to alleviate the learning problems mentioned above, and allowing training the network even with data that are scarce or in small quantities.

The topological optimization method gives the neural network an innovative structure to the extent that a neuron of a layer, including the output layer, can be connected to a neuron of any previous layer, including the input layer. Indeed, when a physical phenomenon depends on a large number of parameters, most of these parameters contribute linearly to the response of the system. Hence the advantage of connecting the corresponding inputs directly to the output layer of the neural network. The effect of weakly non-linear parameters can be taken into account by a single intermediate layer between the input and the output, and so on.

The reduction in complexity of the neural network in fact improves its capacity for generalization (ability to give the right answer on unlearned data). This also makes it possible to alleviate learning difficulties (exploding gradients and vanishing gradients) by reducing the number of layers. Indeed, in a network structured in layers, certain cells may simply be used to duplicate previous cells in order to make them available for the next layer. This unnecessarily increases the complexity of the network.

This neural network, used for modeling a complex physical system, provides a very good quality of simulation for reduced computing times, in particular less than the real time of the physical system. The simulation model can be constructed from measurements made during normal operation of the physical system or during test phases.

In addition, the topological optimization of the network is advantageously carried out by the use of the Lagrange operator, or Lagrangian, applied to the connection weights of the neural network. This method makes it possible to calculate, in a particularly rapid manner, the effect of a topological modification of the network (addition/elimination of a neural cell, addition/elimination of a link), which makes it possible to quickly assess and select the best topological improvement of the neural network at each step.

The feedforward neural network is advantageously used, as a recurrent pattern, in the context of dynamic simulation of physical systems in order to predict a future state of the system on the basis of an initial state and possible source terms or excitations.

The neural network is advantageously combined with an approach in which the data representative of the state of the physical system are compressed. The dynamic model simulates the future state of the system on the compressed data, then decompresses the simulated data to return to real space. Unlike the state of the art concerning the reduced basis described above, the recursive loop is not done in real space but in the space of the compressed data, which eliminates noise in the data while ensuring better stability of the dynamic model. This also makes it possible to reduce computing times in the learning and simulation phases.

Topological optimization plays a major role in the management of dynamic models. Indeed, if we perform m iterations of a recurrent pattern having n layers, the learning difficulty is equivalent to that of a neural network having n×m layers. The present disclosure therefore makes it possible to reduce n, and consequently the number of calculations and their duration, in two different ways:
- by compression which reduces the size of the recurrent pattern,
- by topological optimization which reduces the number of layers of the recurrent pattern.

BRIEF DESCRIPTION OF THE DRAWINGS

Other features, details and advantages of the present disclosure will become apparent from reading the following detailed description, and from analyzing the accompanying drawings, in which:

FIG. 7b shows three different power profiles for an electrical resistor of the system of FIG. 7a.

FIG. 8a represents the compression/decompression network produced to model the data from the sensors of the system in FIG. 7a.

FIG. 8b represents the dynamic modeling network produced to model the data from the sensors of the system in FIG. 7a.

DETAILED DESCRIPTION

Figure 1:
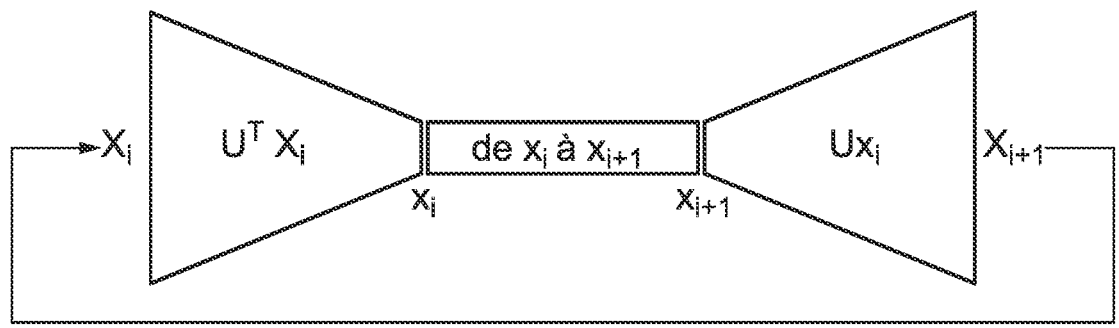
FIG. 1, already described, schematically represents a method of dynamic simulation by means of a reduced projection basis.
Figure 2:
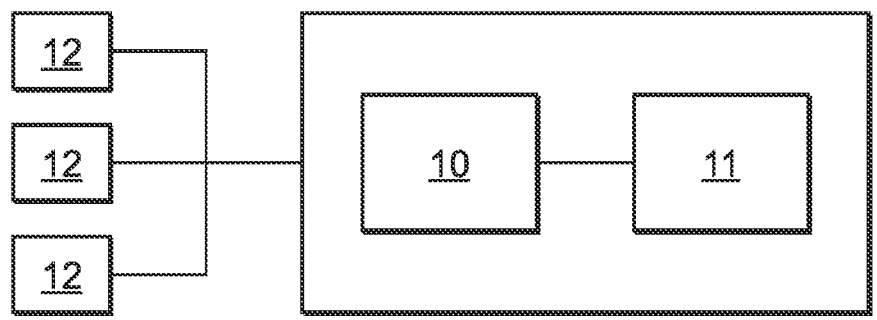
FIG. 2 schematically represents a system for implementing a method of building a neural network and of simulating a physical system.

We will now describe a method of construction of a parsimonious neural network that can be used for modeling a physical system or phenomenon. This method, as well as the methods of data compression, and of simulating a static or dynamic system described below, are implemented by a computer 1 schematically represented in FIG. 2, comprising a calculator (for example a processor) 10, and a memory 11, the computer being able to execute instructions stored in the memory 11 in order to implement these methods. The computer advantageously comprises or may be connected to at least one sensor 12 suitable for acquiring measurements of physical quantities.

The method has two phases: a phase of learning and constructing the model, and a simulation phase for applying the model. The two phases can be carried out on different equipment. Only the simulation phase is intended to occur in real time.

In what follows, a real system is any system whose state can be measured at least in part by sensors of physical quantities. Among the real systems, in particular one can list physical, biological, chemical, and computer systems.

It is assumed that the real system which is to be modeled is governed by a model of the type:

$$Y = f(X) \qquad (1)$$

where X and Y are respectively input and output variables characterizing the state of the system.

For the construction of this model, we have a database of the type $(X_i, Y_i)_{i=1}^M$, generated by measurements on the real system, the data being able to be stored in the memory 11, where:

- $X_i \in \Re^{n_0}$ is an input datum comprising a number $n_0$ of components, the last of which, by way of example, is set to 1, and the remaining $n_0-1$ typically corresponding to physical quantities representative of the state of the system, these data having been measured by means of sensors 12, and
- $Y_i \in \Re^{n_0}$ is an output datum comprising a number $n_O$ of components, which correspond to other physical quantities of the system, these data having also been measured by means of sensors 12.

This database is divided into two disjoint subsets, the first constituting a training database formed by the indices, for example, $i=1, \ldots, M_1$, $M_1 < M$, and the rest of the indices forming a validation database. The purpose of this distribution is to implement a method of cross-validation on the learning of the constructed neural network.

The objective of the method of modeling the physical system is to build an approximate model of (1) in the form:

$$Y \approx f_{\Gamma,W}(X) \quad (2)$$

where $f_{\Gamma,W}$ is a simulation function calculated by a neural network defined by a topology $\Gamma$ and a matrix or a list of matrices of connection weights W, so as to be able to simulate the output Y on the basis of an input variable X.

The topology $\Gamma$ and the matrix W of connection weights are determined by minimization of an error function J of the neural network:

$$\min_{\Gamma,W} J(\Gamma, W) \quad (3)$$

where J quantifies the error between an output of the neural network calculated on the basis of input data $X_i$ and the corresponding target result $Y_i$, calculated on the basis of training data:

$$J(\Gamma,W) := \Sigma_{i=1}^{M1} \|f_{\Gamma,W}(X_i) - Y_i\|^2 \quad (4)$$

Neural Network

Figure 3:
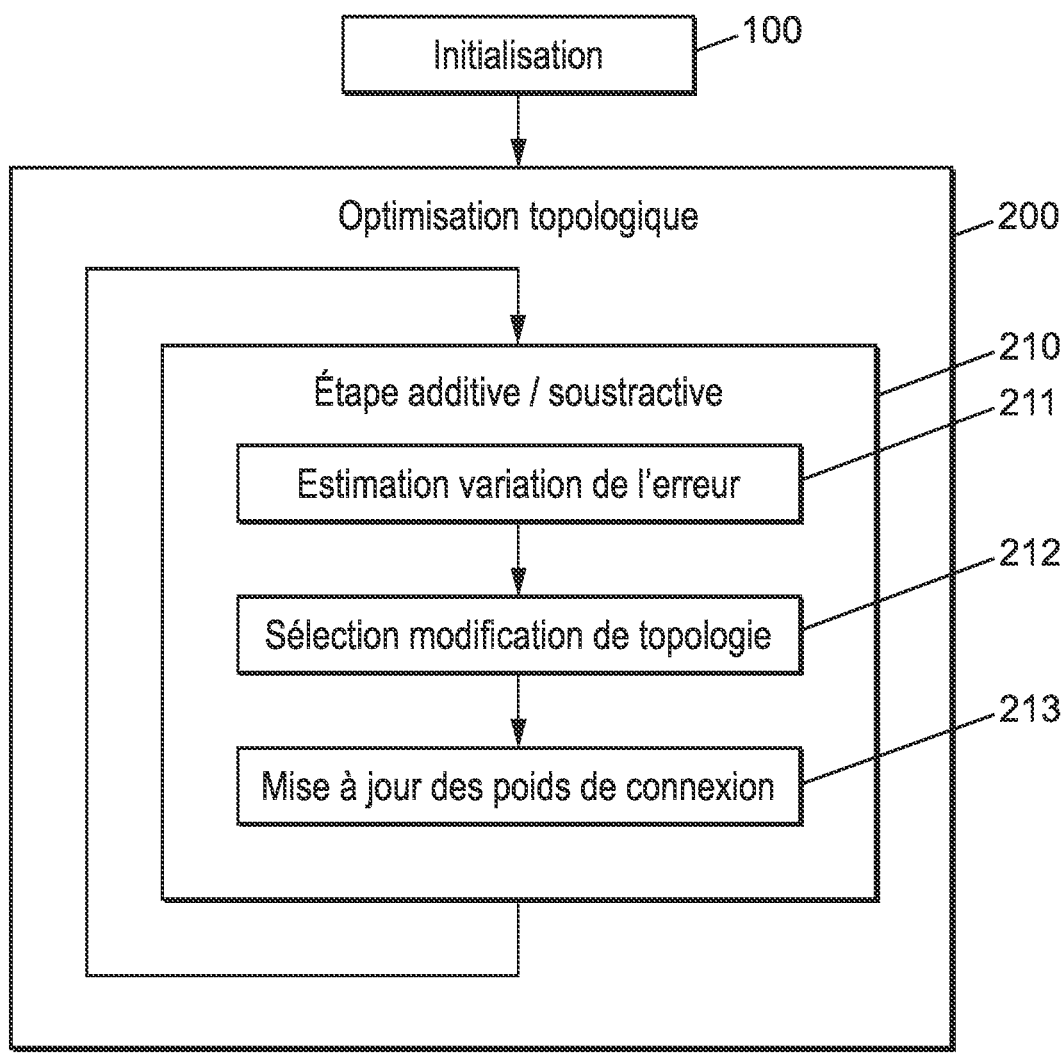
FIG. 3 schematically represents the main steps in constructing a neural network according to one embodiment of the present disclosure.

Referring to FIG. 3, a method of construction of a neural network used for modeling the physical system is schematically represented.

This neural network comprises a set of processing nodes, also called neurons, and of connections between processing nodes, each connection being weighted by a weighting coefficient, the processing nodes and connections forming a topology organized into layers.

Unlike a conventional neural network in which each layer takes its inputs from the outputs of the preceding one and is therefore only connected to the preceding layer, the neural network of the present disclosure is a computational graph in which each layer is defined by the set of nodes which can be calculated simultaneously, and the input of a processing node of one layer can be connected to the output of a processing node of any of the previously calculated layers.

Also as a consequence, the set of processing nodes calculating the outputs of the neural network, hereinafter referred to as the "set of output nodes," does not form a layer because the output nodes may be calculated in different steps and be distributed among several layers.

In addition, the neural network is of the feedforward type, meaning it does not comprise any computation loop that returns the output of a processing node as input to the same node or to a node of a previous layer.

Finally, the training of the neural network is carried out during its construction, so as to adapt the structure of the neural network to the function that it is to calculate.

We denote as $X_i$, $i=1, \ldots$, nc the layer formed by the cells that can be calculated simultaneously in step I, and as $X^i = (X^0, \ldots, X^i)$ the layers already calculated in step i. We posit $X^0 = (X_i)_{i=1}^{M1}$ which is of size $n_0 \times M1$ and represents the state of the input layer (in other words we apply the neural network to the data of the database that we have). We posit $Y = (Y_i)_{i=1}^{M1}$, the target values corresponding to the input $X^0$.

By denoting the number of layers of the neural network as nc, and by associating with layer i a number ni of processing nodes, we associate a matrix of connection weights $W_i$ of size $n_{i+1} \times \Sigma_{j \leq i} n_j$ with each layer. The matrix $W_i$ is very sparse. Most of its columns are zero, and those that are not zero contain many zeros. The set of connection weights of the entire neural network is then $W = (W_0, \ldots, W_{nc-1})$. Abusing the terminology, we will call this object a matrix.

The neural network then carries out the following calculations (hereinafter described as "the calculation algorithm") on the input data X0:

$X^0 = X^0$

For i=1 to nc, $X^i = f_{Si}(W_{i-1} * X^{i-1})$ $X^i = (X^{i-1}, X^i);$

End where the function $f_{Si}$ is the Identity function for the output processing nodes and the sigmoid function:

$$f_{Si}(x) = \frac{1}{1 + \exp(-x)}$$

for the other processing nodes. Let us assume, for example, that the last row of $x^0$ is formed of 1 s. This means that the last cell in the input layer is a bias cell. In conventional architectures, each layer other than the output layer has a bias cell. In the architecture according to this disclosure, only the input layer has a bias cell. Cells in other layers can connect directly to this cell.

The neural network's error function J is then written:

$J = \|OX^{nc} - Y\|^2$ where O is the observation matrix making it possible to extract the output elements of Xnc. Indeed, the number of cells of the last layer, denoted $n_{nc}$, is less than or equal to the size of the output data of the neural network $n_O$. It is for this reason that the observation operator is applied to $X_{nc}$, in other words to all cells in the network.

The topology $\Gamma$ of the neural network is defined by the incidence matrices of the computation graph $\Gamma = (M_0, \ldots, M_{nc-1})$, where $M_i$ is an incidence matrix which has the same size as $W_i$ which is equal to 1 for the non-zero coefficients of $W_i$ and zero elsewhere.

Returning to FIG. 3, the method of construction of the neural network comprises a first step 100 of initialization of a neural network according to an initial topology which may be minimal, namely comprising:

- an input layer, comprising a set of input processing nodes whose number of nodes is imposed by the number $n_0$ of input data including a bias,
- an output layer whose number of nodes $n_{nc}$ is less than the number $n_O$ of output data, and
- at least one hidden layer containing at least one neuron.

The initialization step also comprises a determination of the optimal connection weights $W^{1*}$, i.e., connection weights minimizing the error function J for the fixed initial topology $\Gamma^1$, denoted $JJ(\Gamma^1, W^{1*})$. This determination is made by training the neural network on the training data.

Gradient backpropagation can be used for this purpose, but the quantitative and deep phenomena require the use of the zero-memory Gauss-Newton method described in Fehrenbach, J., Masmoudi, M., Souchon, R., & Trompette, P. (2006). Detection of small inclusions by elastography. Inverse problems, 22(3), 1055.

The zero-memory Gauss-Newton method combines gradient backpropagation with a method of gradient forward propagation. It makes it possible to improve local convergence considerably.

The method then comprises at least one phase of topological optimization 200 of the neural network, determined so as to reduce the error J of the network.

The topological optimization phase may comprise:
- at least one additive phase, wherein at least one processing node and/or at least one connection is added to the neural network, the added connection being such that it links the input of a neuron to the output of a neuron of any previous layer, and/or
- at least one subtractive phase, wherein at least one processing node and/or at least one connection is deleted from the neural network.

In addition, each topology modification 210, additive or subtractive, comprises a selection 212 among a plurality of candidate topological modifications, based on an estimation 211 of the variation in the network error between each topology modified according to a candidate modification and the previous topology, the selected topological modification being the one which optimizes the variation of the error relative to the preceding topology, the goal being to maximize the reduction of the error at each iteration. As we will see, however, subtractive topology modifications can, in a given iteration, induce an increase in the error J on the training data while still making it possible to improve the accuracy of the network by reducing its error on the validation data.

There remains to define the choice of candidate topological modifications. In the case of a subtractive phase, all nodes and links are candidates in turn for a topological modification.

In an additive phase, one can connect, by a link, two nodes which do not belong to the same layer and which are not already connected. Nodes can be added to any layer other than the input and output layers of the network. A new layer can also be created by inserting a node between two successive layers. A created node must be connected to the network by at least two links: at least one input link and at least one output link. The choice of which links to add can be made randomly. In an additive phase, if the network is large, one can choose a thousand candidate topological modifications taken at random. The estimate of the variation for these candidate disruptions is calculated. The best disruptions:
- those which create the smallest estimated increase in the error J, for a subtractive phase,
- those which offer the greatest estimated decrease in the error J, for an additive phase, are retained to define the topology $\Gamma^n$.

The variation in network error between a modified topology (candidate for iteration n) and the previous topology (iteration n−1) is measured with the optimal connection weights for each topology considered, meaning that it is written:

$$J(\Gamma^n, W^{n*}) - J(\Gamma^{n-1}, W^{n-1*})$$

where $\Gamma^n$ is the topology modified according to the candidate modification at iteration n, and $W^{n*}$ is the matrix of optimal connection weights for this topology.

However, the computation of a matrix of optimal connection weights for a given topology is very long, and it is not easy to calculate this error variation for all candidate topological modifications considered.

We will therefore describe how to estimate this error variation rather than how to calculate it.

According to a first embodiment, for an additive phase, the connection weights $W^n$ of the modified topology are initialized by:

$W^n = W_{|\gamma}^{n-1*}$, with $\gamma$ being the set of links of $\Gamma^n$ included in that of $\Gamma^{n-1}$, and the other links of $\Gamma^n$ are initialized to 0.

This initialization does not aggravate the error; we have $J(\Gamma^n, W^n) = J(\Gamma^{n-1}, W^{n-1*})$.

Then a few training iterations are carried out in order to improve $W^n$, and the variation of the error is estimated by: $J(\Gamma^n, W^n) - J(\Gamma^{n-1}, W_{n-1}^*)$, which is necessarily negative or zero. The purpose of the additive phase is to carry out learning.

In the case of a subtractive phase, the connection weights $W^n$ of the modified topology are initialized by $W^n = W_{|\gamma}^{n-1*}$, then several training iterations can be performed in order to improve $W^n$.

The estimate of the error is then also: $J(\Gamma^n, W^n) - J(\Gamma^{n-1}, W^{n-1*}))$.

This variation is necessarily positive or zero. Otherwise $W^{n-1*}$ is not optimal. Indeed, matrix $W^n$ would offer a better solution by setting the removed links to zero. This phase, which only increases the error, has the purpose of ensuring generalization: the prediction ability of the neural network with data that are not part of the training set. As the error function J increases, the average error on the validation data tends to decrease.

According to a more advantageous variant embodiment, the estimation of the error between a modified topology and the previous topology is carried out on the basis of the Lagrange operator, or Lagrangian, applied to the internal variables of the neural network that are the layers of the network $X = (X^0, \ldots, X^{nc})$, which is written:

$$\mathcal{L}(\Gamma, W, X, \Lambda) = J(\Gamma, W) + \Sigma_i tr(\Lambda_i^T (X^i - f_{Sf}(W_{i-1} * X^{i-1}))) \quad (5)$$

where $\Lambda = (\Lambda_i)$, $\Lambda_i$ being the Lagrange multiplier associated with the equation defining $X^i$. The multiplier $\Lambda_i$ has the same size as $X^i$. The function tr is the trace, meaning the sum of the diagonal terms of a matrix. According to the calculation algorithm described above for the neural network, if W and $X^0$ are known, it is possible to construct all the $X^i$ and then all the $\Lambda_i$. The $\Lambda_i$ are well-defined and are obtained by solving the equations:

$$\partial_{X^i} \mathcal{L}(\Gamma, W, X_W, \Lambda) = 0, \quad (7)$$

We refer to the Appendix at the end of the description for the solving of these equations.

However, we can see that for any given W, if X is obtained by the calculation algorithm described above, then the terms under the summation symbol of equation (5) cancel each other out and we obtain the following equality:

$$J(\Gamma, W) = \mathcal{L}(\Gamma, W, X_W, \Lambda) \quad (6)$$

Thus, for any W we have an equality between the error of the neural network and of the Lagrangian applied to it. From this we can deduce:

$$d_W J(\Gamma, W)\delta W = d_W \mathcal{L}(\Gamma, W, X_W, \Lambda)\delta W \quad (8)$$

where $d_W$ is the total derivative with respect to W and $\delta W$ is the variation of W. Since J only depends on W via X, the total derivative is written:

$$d_W J(\Gamma, W)\delta W = \partial_W J(\Gamma, W)\delta W + \partial_X J(\Gamma, W)\partial_W X \delta W = 2(OX^{nc} - Y)\partial_W X \delta W. \quad (9)$$

Here the total derivative $d_W$ takes into account $\partial_W$, the partial derivative with respect to W, and takes the variation into account via the variable X. This expression is unusable because of the cost of computing $\partial_W X$. According to equality (6), this derivative of J can also be calculated explicitly without having to calculate $$\partial_W X: \quad (10)$$
$$d_W J(\Gamma, W)\delta W = d_W \mathcal{L}(\Gamma, W, X_W, \Lambda)\delta W =$$
$$\partial_W \mathcal{L}(\Gamma, W, X_W, \Lambda)\delta W + \partial_X \mathcal{L}(\Gamma, W, X_W, \Lambda)\partial_W X \delta W$$

However, as in the construction of $\Lambda$, we have $\partial_X \mathcal{L} = 0$ and therefore we obtain the following formula:

$$d_W J(\Gamma, W)\delta W = \partial_W \mathcal{L}(\Gamma, W, X_W, \Lambda)\delta W \quad (11)$$

The $\Lambda_i$ are chosen so that the variation of the Lagrangian compared to the $X^i$ is zero. The Lagrangian behaves as if we had locally eliminated the variable $X^i$. It follows that, for any fixed $W_0$, we calculate $X_{W_0}$ and $\Lambda_{W_0}$ and for any W close to $W_0$ we have:

$$J(\Gamma, W) \sim \mathcal{L}(\Gamma, W, X_{W_0}, \Lambda_{W_0}). \quad (12)$$

This result is advantageously transposed to the selection of a candidate topological modification which minimizes the error function. Indeed, we can then estimate, for a subtractive topological modification in iteration n, the variation of the network error between a topology $\Gamma^n$ calculated according to a candidate modification and the previous topology $\Gamma^{n-1}$ is estimated by calculating the quantity:

$$\mathcal{L}(\Gamma^n, W^n, X, \Lambda) - J(\Gamma^{n-1}, W^{n-1*}), \quad (13)$$

where $W^n = W_{|\Gamma^n}^{n-1*}$ is a simple restriction of $W^{n-1*}$ to the new topology $\Gamma^n$. Quantity (13) can be calculated quickly and therefore allows selecting the best candidate modification in each iteration.

In the case of an additive topological modification, the variation of the network error between a calculated topology and the previous topology is estimated by calculating the quantity:

$$\mathcal{L}(\Gamma^n, W^n, X, \Lambda) - J(\Gamma^{n-1}, W^{n-1*}) \quad (14)$$

where $W^n$ is a matrix of connection weights of the network after the candidate topological modification in iteration n, said matrix being initialized with the same connection weights as matrix $W^{n-1*}$ for the same connections and a zero-connection weight for each link created during the additive phase. At this level of initialization, the variation given by (14) is equal to zero. To estimate the potential variation, after a learning phase, it is sufficient to minimize the Lagrangian in relation to the only links created. This is a form of application of the Pontryagin principle:

Ross, I. M. (2015). A primer on Pontryagin's principle in optimal control (Vol. 2). San Francisco, CA: Collegiate publishers.

The error variation estimates (13) and (14) can be improved by updating $W^n$:

It is sufficient to apply to $W^n$ one or two learning iterations with fixed $\Gamma^n$, By analogy with Pontryagin's minimum principle, we can minimize $\mathcal{L}(\Gamma^n, W^n, X, \Lambda)$ with respect to $W^n$. This minimization is done with fixed X and $\Gamma^n$.

Returning to FIG. 3, the topological optimization phase 200 typically comprises several topological modifications of each additive and subtractive type.

The additive phases are implemented to lower the error value J on the training data. The subtractive phases are implemented if the error on the training data becomes less than the error on the validation data, beyond a certain limit. This in effect means that the neural network has performed overfitting which leads it to give the wrong answer for data not learned (validation data).

Finally, the topological optimization iterations stop when no topology modification leads to an improvement in the precision of the network, in other words when it no longer reduces the errors on the validation data or the training data after optimization of the connection weights.

Finally, for each topological optimization phase 200, once a topological modification has been selected, the method comprises the updating 213 of the matrix of connection weights of the network by a descent method of the gradient backpropagation type:

$$W^n \leftarrow W^n - \rho \nabla J(W^n) \quad (15)$$

where $\rho$ is the learning rate. One can also use the zero memory Gauss-Newton method.

If we compare this approach with that of the state of the prior art, we see that learning occurs after each topological modification; we thus need a fast convergence algorithm. The state of the prior art relies on redundancy to avoid local minima. In a parsimonious context, local minima are present, but the addition of new degrees of freedom allows us to locally modify the error function J.

Figure 4A:
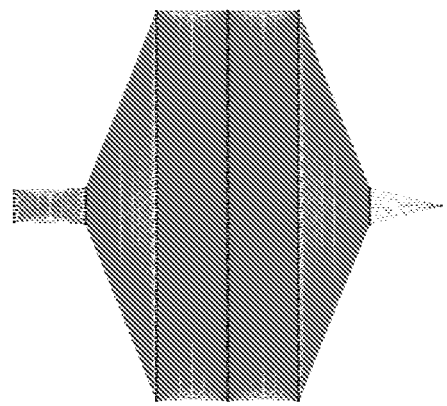
FIG. 4a represents an example of a neural network obtained by prior art software for a given application. This is the best result obtained by the software of the prior art, after having performed fifty trial-and-error experiments.
Figure 4B:
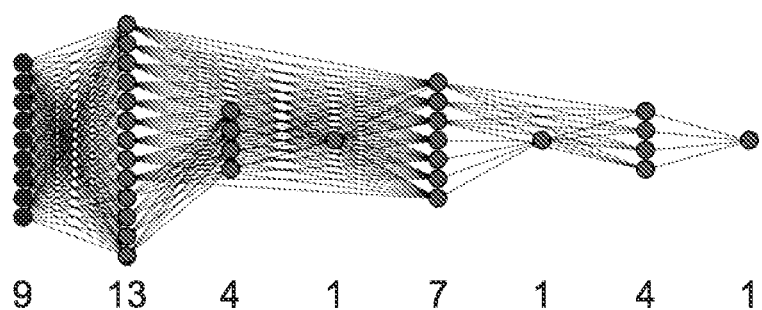
FIG. 4b represents an example of a neural network obtained by implementing the method of construction according to an embodiment of the present disclosure, for the same application as that of [FIG. 4a].

Represented in FIGS. 4a and 4b is an example comparison between a neural network (FIG. 4a) for a telephone location-determination application, obtained by applying prior art software, and a neural network constructed according to the method described above (FIG. 4b) for the same application.

One will observe that the neural network provided by the prior art software is organized by layers, each layer communicating only with the adjacent layers, and this neural network comprises 22,420 links. The network obtained by applying the above method comprises 291 links and the layers which are visible are only the graphic visualization of the processing nodes which can be calculated simultaneously. One will note that the processing nodes of a layer can communicate with the nodes of all previous layers.

Simulation Method

Once the neural network has been obtained and trained on the database $(X_i, Y_i)_{i=1}^M$ it can then be applied to new data which are denoted as theoretical data $(X_i)_{i \in S}$ or data captured by one or more sensors on the physical system to be simulated in order to generate results $(Y_i)_{i \in S}$. S represents the set of data for the simulation, and it is therefore disjoint from the set of training and validation data indexed from 1 to M.

Typically, the $(X_i)_{i \in S}$ data are representative of certain quantities characterizing the state of the real system, these data able to be measured, and the $(Y_i)_{i \in S}$ data can be representative of other quantities characterizing the state of the physical system, these data possibly being more difficult to measure, hence the need to simulate them. The $(X_i)_{i \in S}$ data can include control data or actuator state data; the goal of the simulation can be to determine the choice of $(X_i)_{i \in S}$ which allows having the best response from the $(Y_i)_{i \in S}$ system.

We can consider many possible applications, such as:

determining the location of a mobile phone based on the strength of the signals received at several telephone relays, determining the energy consumption of a building, from meteorological data, expressing the torque of an electric motor as a function of the three phases of electric power.

For these three examples, a simulation of each system was made by means of a neural network according to the above description, compared to a simulation by means of the prior art software already compared in the previous section.

In this comparison, the neural network according to the present disclosure is executed only once on each test case. Conversely, the prior art software requires specifying the number of layers, the number of cells per layer, and the weight of the links between the cells, so that 50 error tests were carried out with this prior art software. [Table 1] below shows the mean of the error, the standard deviation of the error, and the best error obtained; note that the error obtained by the neural network described above is always less than the best error obtained by the prior art software.

TABLE 1

| | | Prior art software (~50 tests) | Neural network of the present disclosure |
|---|---|---|---|
| Determining the location of a telephone | Mean error | 0.0895 | 0.019 |
| | Standard deviation | 0.09 | — |
| | Best error | 0.0193 | — |
| | Number of links | 22 421 | 291 |
| Energy consumption of a building | Mean error | 0.0737 | 0.0586 |
| | Standard deviation | 0.0133 | — |
| | Best error | 0.0596 | — |
| | Number of links | 12 300 | 116 |
| Motor torque | Mean error | 0.02533 | 0.0102 |
| | Standard deviation | 0.2071 | — |
| | Best error | 0.0111 | — |
| | Number of links | 28 700 | 232 |

Figure 4C:
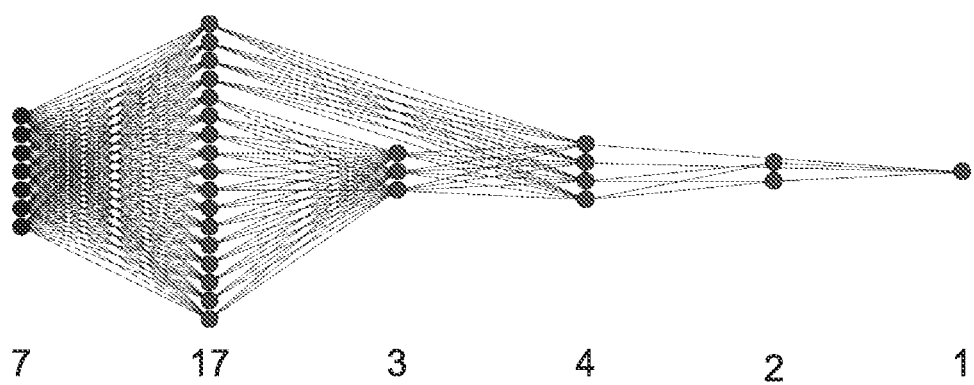
FIG. 4c represents another example of a neural network obtained by implementing the method of construction according to one embodiment of the present disclosure, to model a complex system involving fluid-structure interactions in the automotive field.

Another comparison can be made between the performance of the present disclosure applied to modeling a complex phenomenon involving fluid-structure interactions in the automotive field, and the performance obtained by a major player in the digital field by exploiting a solution available for purchase. The neural network obtained by the present disclosure for this application is shown in FIG. 4c and the performance comparison can be found in [Table 2] below.

TABLE 2

| | Prior art solution | Present disclosure |
|---|---|---|
| Training data (Percentage of available data) | 1 000 000 samples (100%) | 10 000 samples (1%) |
| Size of network (number of links) | 500 000 | 194 |
| Computer resources | A $15,000 GPU | 1 min 13 sec' on a laptop |
| Energy consumption | 1 kWh | 0.0005 kWh |

Compression

The method described above for constructing a neural network can also be used for data compression.

Figure 5:
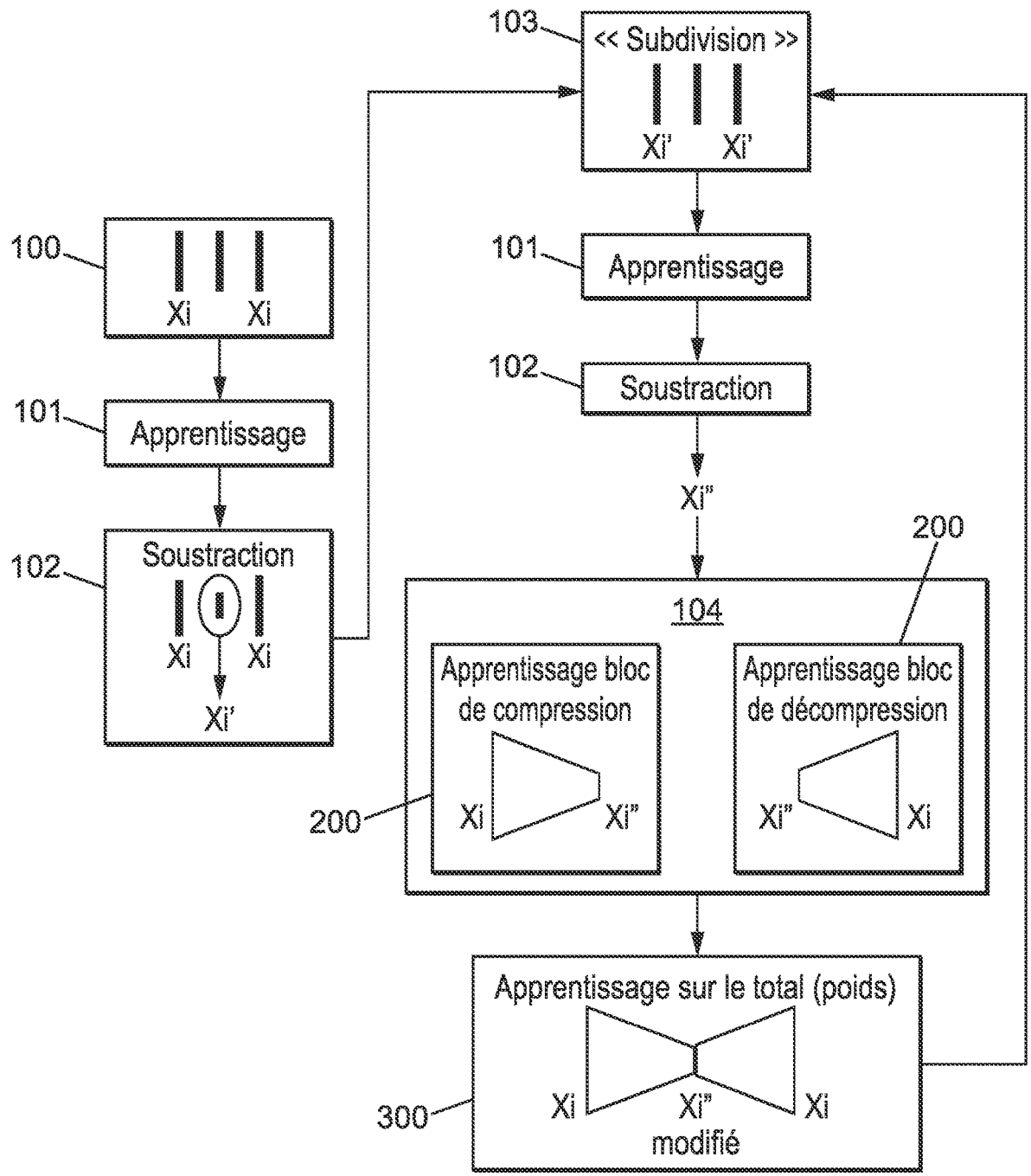
FIG. 5 schematically represents an example construction of a neural network comprising a compression block and a decompression block.

In this regard, and with reference to FIG. 5, a neural network is constructed comprising a compression block C and a decompression block D, in which the compression block and the decompression block are neural networks constructed according to the method described above, using training and validation databases comprising pairs in the form $(X_i, X_i)_{i=1}^M$.

The construction of the compression neural network comprises a step 100 of initialization of a neural network which comprises:

An input layer receiving an input $X_i$,

A set of processing nodes forming an output layer generating an output $X_i$ that is identical to the input, and A hidden layer that has the same number of processing nodes as the input layer and the output layer.

The method then comprises a learning step 101 to train this initial neural network on the training database, then a subtractive phase 102 in accordance with a subtractive phase of the topological optimization step described above, to reduce the size of the hidden layer without adversely affecting the learning. We denote as $X_i'$ the compression of $X_i$ at the hidden layer.

The method then comprises a step of subdivision 103 of the hidden layer into three layers of the same size, and a reiteration of the learning step 101 on the sub-network formed, and of the subtractive step 102 on the new central layer.

A compression block C which is formed by all the layers between the input layer and the central layer, and a decompression block D which is formed by all the layers between the central layer and the output layer, are then defined, and the topological optimization step 200 is implemented separately for each block.

The method then comprises a learning step 300 on the entire network thus formed. Steps 103 to 300 can then be iterated until it becomes impossible to reduce the size of the compressed vector without significantly aggravating the decompression error.

The compression ratio obtained makes it possible to describe very complex structures with only a few variables. To illustrate the power of these nonlinear compression methods, we can give an example where $X_i = e_i$, the $i^{th}$ element of the canonical basis. No compression is possible by classical linear methods. But we can see that the vectors $X_i$ are parameterized by a single variable, the index i.

Advantageously, the compression block and/or the decompression block thus created can be used to model a real system whose inputs and/or outputs are of large dimensionality.

In the case of an input of large dimensionality, we can for example insert a modeling block just after the compression block, to obtain a neural network comprising:

A compression block, suitable for compressing input data $X_i$, such that $x_i = C(X_i)$, A modeling block, suitable for calculating a function $Y_i = f(x_i)$ on compressed data, and Here the decompression block only serves to ensure that the xi indeed represent the Xi by ensuring that $Xi \approx D(xi)$. In this case, the method of construction advantageously comprises at least one additional learning phase at fixed topology on the entire network f·C. This allows the decompression to be corrected according to the application, i.e., modeling. Indeed, the compression process ignores the goal of reaching $Y_i$.

We can take the example of a system that models the risk of developing a disease, based on the genetic characteristics of an individual. The input data to the network can have hundreds of thousands of inputs, while the output is reduced to a single scalar. The best results obtained in this field are based on the process given above.

Outputs of large dimensionality result in a high compression ratio. This phenomenon can be explained by the cause-and-effect link that ties the Xi to the Yi. For example, we can insert a modeling block just before the decompression block, to obtain a neural network comprising:

An adapted modeling block in which the outputs $Y_i$ have been replaced by their compressed version $y_i$, which gives $y_i=f(X_i)$, A decompression block, adapted to obtain the output data $Y_i$, from compression coefficients $y_i$ such that $Y_i=D(y_i)$.

It is advantageously possible to carry out a final training at fixed topology of the global network D·f.

In the experimental approach, in particular for simulated experiments, we can have $X_i$ of very large dimension, which by their very construction are non-compressible. The $Y_i$ which are generally compressible. Indeed, the solving of partial differential equations has a regulating effect. The act of constructing the model $y_i=f(X_i)$ shows that ultimately, in a certain sense, the $X_i$ are compressible: their effect on $Y_i$ is compressible.

Dynamic System

The method of construction of a neural network can also be used for modeling a dynamic physical system, in which one seeks to determine a future state of a physical system based on information about its current state.

In this regard, a neural network is constructed comprising a compression block, a modeling block, and a decompression block, in which at least the compression block and the decompression block are neural networks constructed according to the method described above, using training and validation databases comprising pairs of the form $(X_i, X_i)_{i=1}^M$.

Here, each $X_i$ represents the state of the system at successive times. If $((z_i)_{i=-p}^M$ represents the instantaneous state of the studied system, then $$X_i = \begin{pmatrix} z_i \\ z_{i-1} \\ \vdots \\ z_{i-p} \\ 1 \end{pmatrix}.$$

The bias is added to the data, for reasons explained above. In methods such as the ARMA method or NARX-type recurrent networks, the next step depends on the previous p+1 steps. The use of this technique improves the stability of the model. But it also increases the size of the model and reduces its capacity for generalization.

Compression of $X_i$ makes it possible to reduce the size of the recurrent pattern, while increasing p to ensure better stability.

This compression has the advantage of filtering out the noise from $X_i$, which is essential in the context of measured data.

Figure 6A:
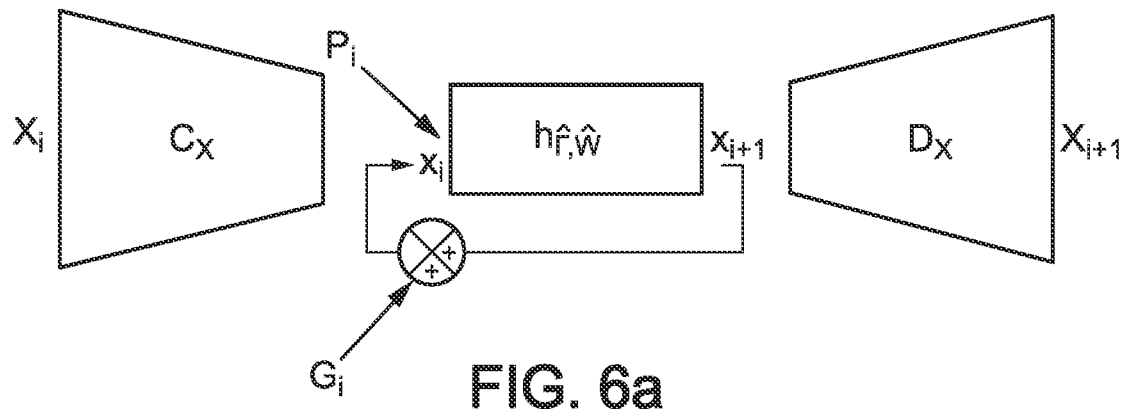
FIG. 6a represents the implementation of a method of dynamic modeling according to an alternative embodiment of the present disclosure.
Figure 6B:
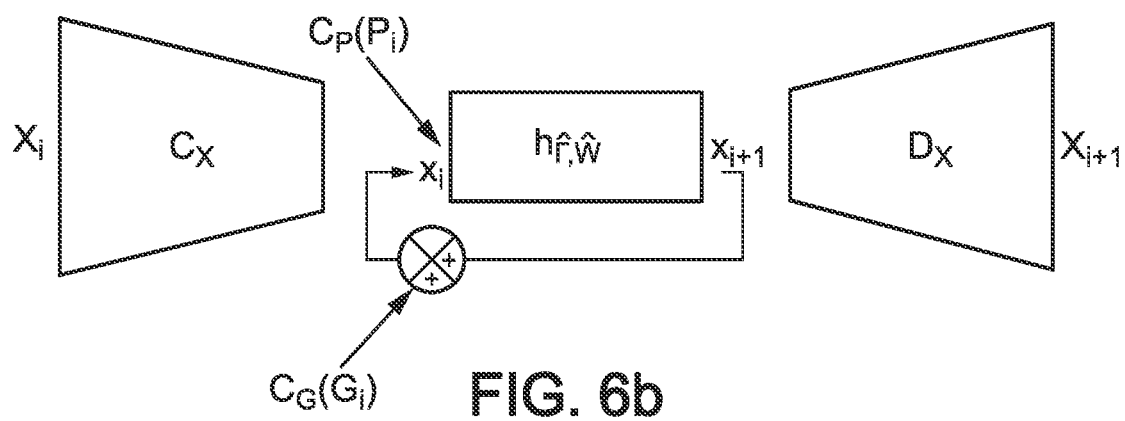
FIG. 6b represents the implementation of a method of dynamic modeling according to another alternative embodiment of the present disclosure.

For modeling a dynamic physical system, with reference to FIGS. 6a and 6b, between the compression block C and the decompression block D which are constructed in accordance with the preceding description, is inserted a block h suitable for modeling the dynamic behavior of the real system, which is of the form:

$$X_{i+1}=F(X_i,P_i)+G_i, \ i\geq 0 \quad (16)$$

where $G_i$ corresponds to one or more excitations representing the environment of the simulated system and $P_i$ describes the internal state of the system.

The system is only known through a few measurements made over time:

$$\chi=(X_0,X_1,\ldots,X_M)$$

$$G=(G_0,G_1,\ldots,G_M) et \ P=(P_0,P_1,\ldots,P_M).$$

The modeling block is advantageously a neural network suitable for reproducing a model of the form:

$$x_{i+1}=h_{\hat{\Gamma},\hat{W}}(x_i,p_i)+g_i, \ i\geq 0$$

$$x_0=C_X(X_0)) \quad (17)$$

where:

$x_i$ is a compression of $X_i$ by the compression block $x_i=C_X(X_i)$ $h_{\hat{\Gamma},\hat{W}}$ is the function calculated by the modeling block, $\hat{\Gamma}$ and $\hat{W}$ are respectively the topology and the matrix of the connection weights of the modeling block, and $p_k$ and $g_k$ are the data representative of the excitation and of the internal state of the system on which the modeling block is implemented.

In one embodiment, schematically shown in FIG. 6a, the number of parameters for the internal state $P_i$ and the excitation number $G_i$ is low, for example less than the size of $x_i$; we then can take $p_i=P_i$ and $g_i=G_i$.

The determination of $h_{\hat{\Gamma},\hat{W}}$ is then done by solving the following optimization problem:

$$\min_{\hat{\Gamma},\hat{W}} \sum_{i=0}^{M} \|h_{\hat{\Gamma},\hat{W}}(x_i, p_i) + g_i - x_{i+1}\|^2 \quad (18)$$

The minimization with respect to $\hat{\Gamma}$ is advantageously carried out by the topological optimization step 200 described above, and for fixed $\hat{\Gamma}$, a zero memory Gauss-Newton technique is used to estimate W.

Otherwise, in the case where the number of parameters for P and G is higher, these parameters are also compressed to obtain $$p_i=C_P(P_i)$$

$$g_i=C_G(G_i)$$

where:

$C_p$ is a compression operator, possibly linear, suitable for compressing data $P_i$ into data $p_i$, and $C_G$ is a compression operator, possibly linear, suitable for compressing data $G_i$ into data $g_i$ of size equal to that of data $x_i$.

This is compression induced by that of the $X_i$. Although $P_i$ and $G_i$ do not easily lend themselves to compression, their effect on the dynamic system is compressible. FIG. 6b shows that the compression of the $X_i$ induces a compression on the excitations $G_i$. Indeed, as the $X_i$ come from integration of a difference equation, they are more regular than the excitations $P_i$ and $G_i$. Therefore, their effect on the model is compressible.

This embodiment is schematically shown FIG. 6b. In this case, the determination of is done by solving the following optimization problem:

$$\min_{\hat{\Gamma},\hat{W},C_P,C_G} \sum_{i=0}^{M} \|h_{\hat{\Gamma},\hat{W}}(x_i, p_i) + g_i - x_{i+1}\|^2. \quad (19)$$

The minimization with respect to $\hat{\Gamma}$ is performed by the topological optimization step 200 described above, and for fixed $\hat{\Gamma}$, a zero memory Gauss-Newton technique is used to estimate W, $C_P$ and $C_G$.

In this method, the recursive loop does not occur in the real space of the Xi but in the space of the compressed data. This compression reduces noise in the data and ensures better stability of the dynamic model, while reducing computation times in the training and simulation phases. Regardless of the method used to initialize W and possibly to update it, the number of topological changes to be tested can increase very quickly with the size of the neural network. To limit the number of calculations, we can randomly choose the configurations to be tested and only retain the one that gives the best estimate for reducing the error.

EXAMPLE

By way of illustration, an example of a possible application that is in no way limiting is that of modeling the melting of a solid sodium block.

Figure 7A:
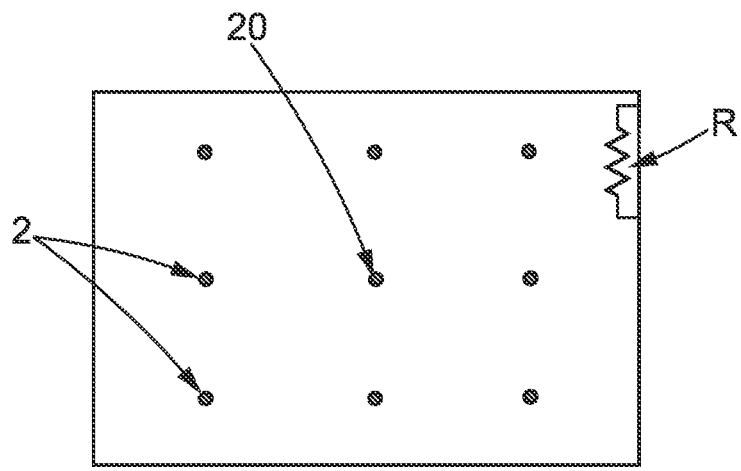
FIG. 7a schematically represents a top view of a system for measuring the progress of a sodium melting front.

Referring to FIG. 7a, consider a square container of small height that contains sodium in a solid state. FIG. 7a is a top view of this container, which is heated by an electrical resistor positioned in a corner of the container for the purpose of melting the sodium.

Figure 7B:
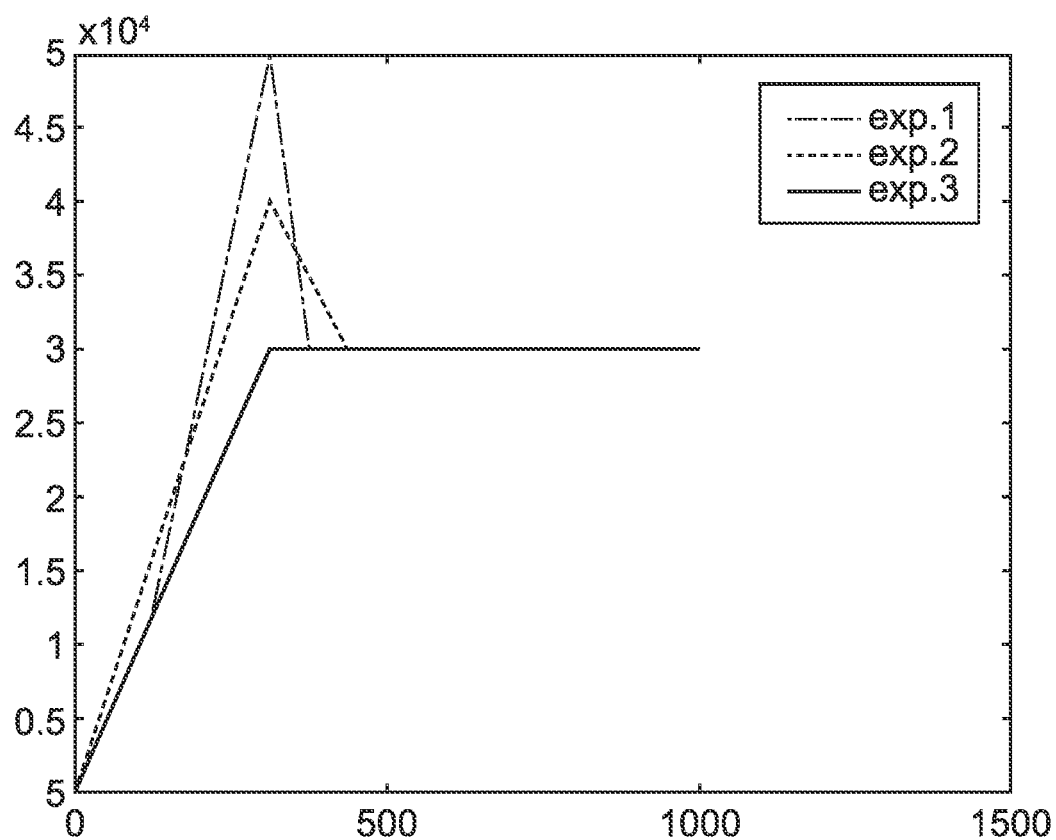

Three experiments are carried out. During each experiment, the resistor is respectively powered by one of the three power profiles shown in FIG. 7b. In this figure, the time in seconds is shown on the x-axis and the power delivered to the resistor in Watts is shown on the y-axis.

The response of this system is represented by nine temperature sensors 2, which solely provide the value of 0 if the temperature does not exceed the sodium melting point, and 1 if this value is exceeded.

If we denote as z, the vector formed by the nine measurements at a time i, then $X_i$ represents the state of the system at the successive times i and i−1:

$$X_i = \begin{pmatrix} z_i \\ z_{i-1} \\ 1 \end{pmatrix}.$$

A "digital twin" of this dynamic system is established based on data measured during the first experiment with the first power profile, and according to the method of simulation of a dynamic system described above, by first performing a compression of the $X_i$.

Figure 8A:
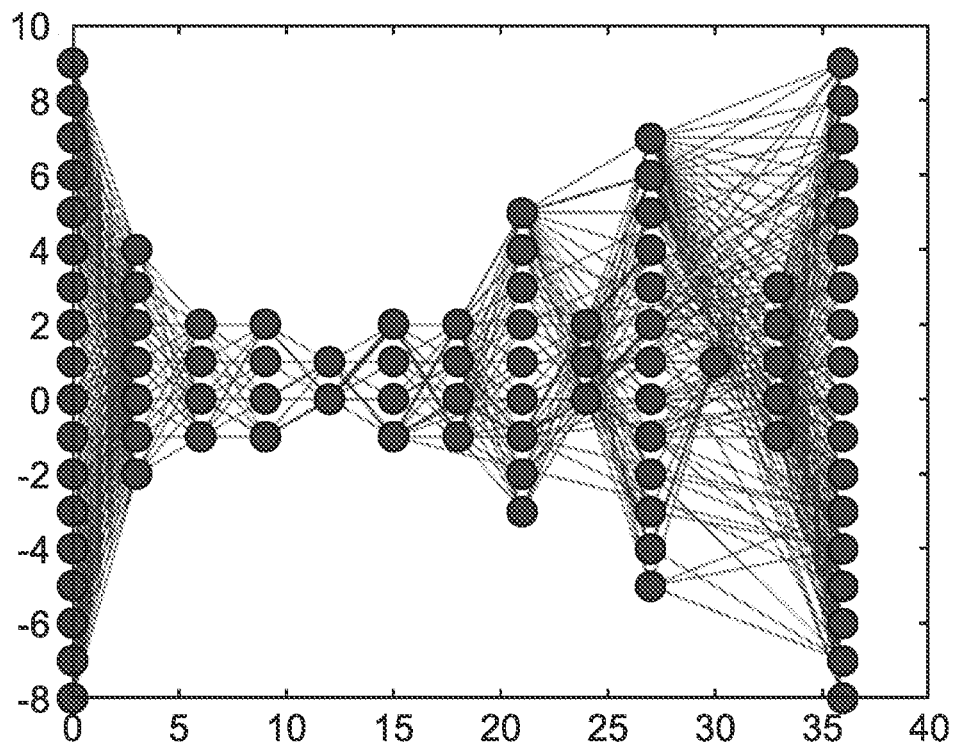

The compression results in a neural network comprising 18 inputs (two for each of the nine sensors) and 18 outputs. With reference to FIG. 8a, which shows a neural network for compressing then decompressing the $X_i$, it can be seen that the compression makes it possible to represent each $X_i$ by only two coefficients.

Figure 8B:
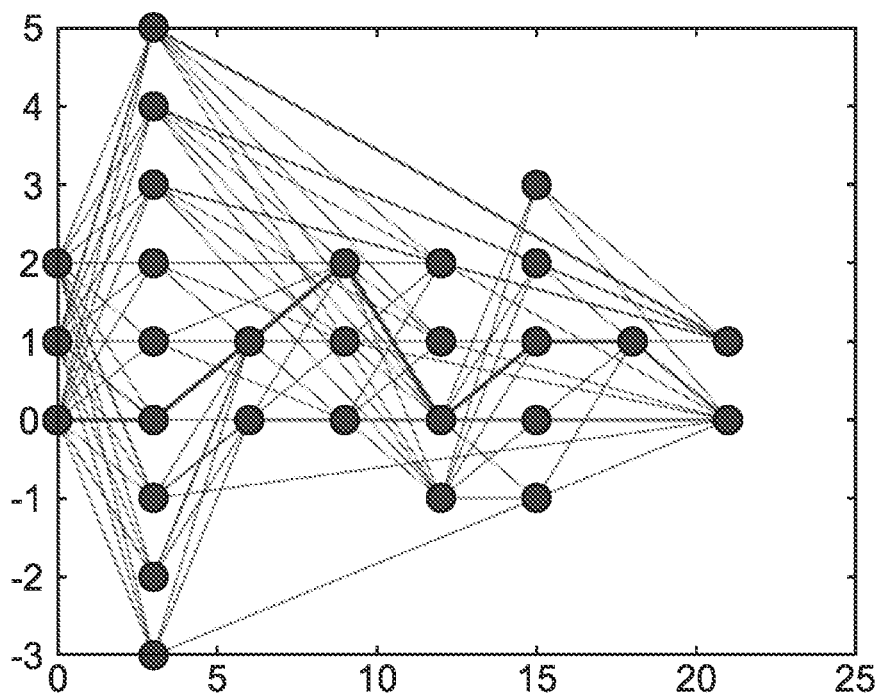

A dynamic modeling block in the form of a recurrent neural network, of which the pattern is shown in FIG. 8b, is then inserted between the compression block and the decompression block. The third input of this network (at 2 on the y-axis) corresponds to the power injected into the resistor. In FIG. 8b, the thickness of each connection represents its intensity, meaning that it is representative of the relative weight of the connection. It can be seen that excitation plays an important role. To improve the readability of FIGS. 8a and 8b, we have not shown the bias, which is connected to practically all nodes in the network.

Figure 9A:
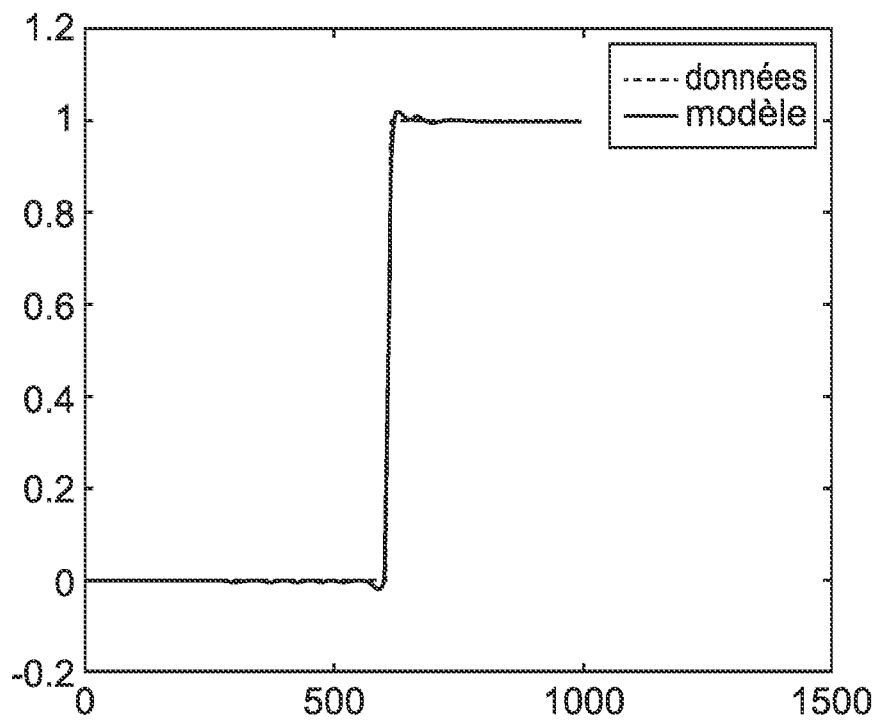
FIG. 9a represents, for a sensor of the system of FIG. 7a, a comparison between the sensor data and the modeling data for one of the three power profiles of FIG. 7b.
Figure 9B:
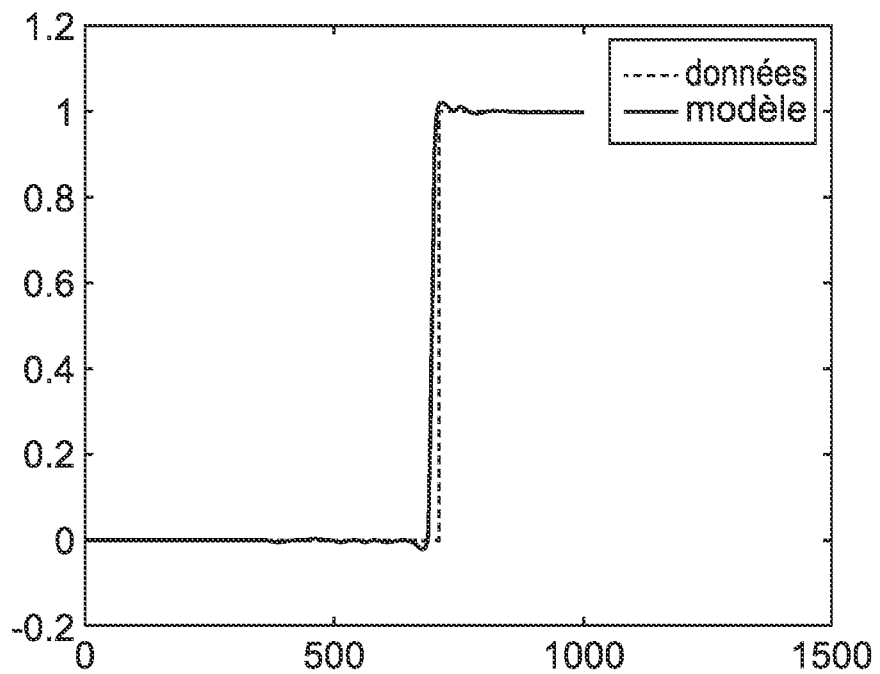
FIG. 9b represents, for a sensor of the system of FIG. 7a, a comparison between the sensor data and the modeling data for another of the three power profiles of FIG. 7b.
Figure 9C:
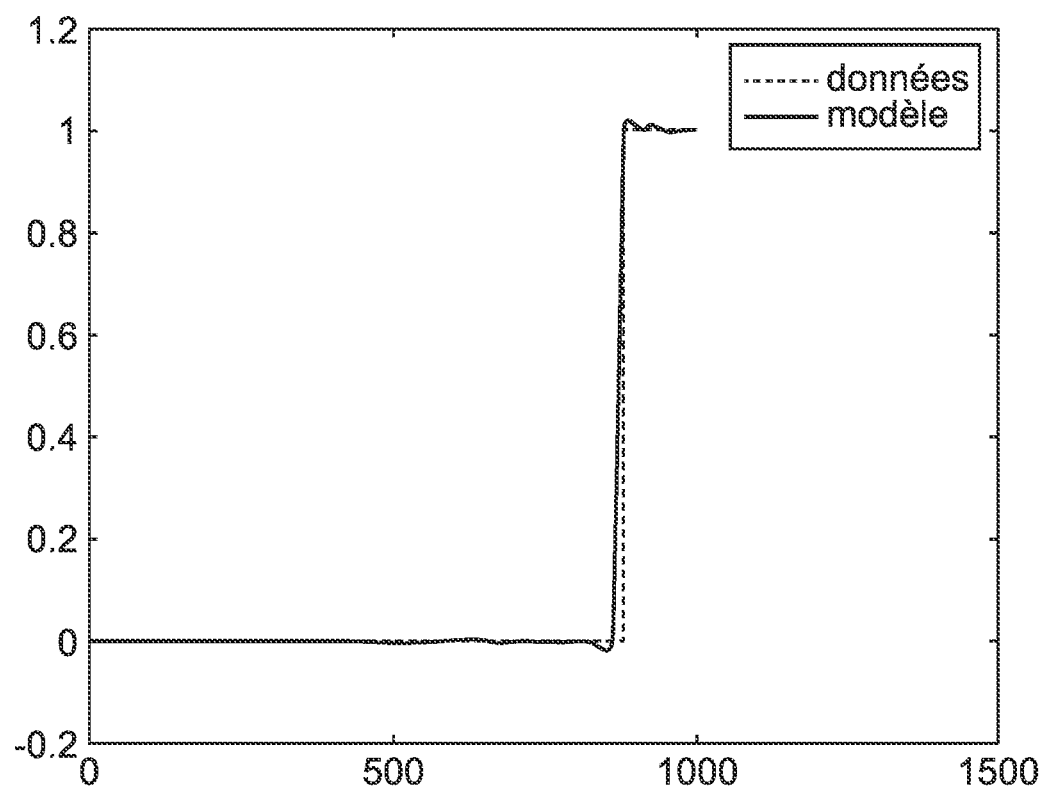
FIG. 9c represents, for a sensor of the system of FIG. 7a, a comparison between the sensor data and the modeling data for the last of the three power profiles of FIG. 7b.
Figure 1:
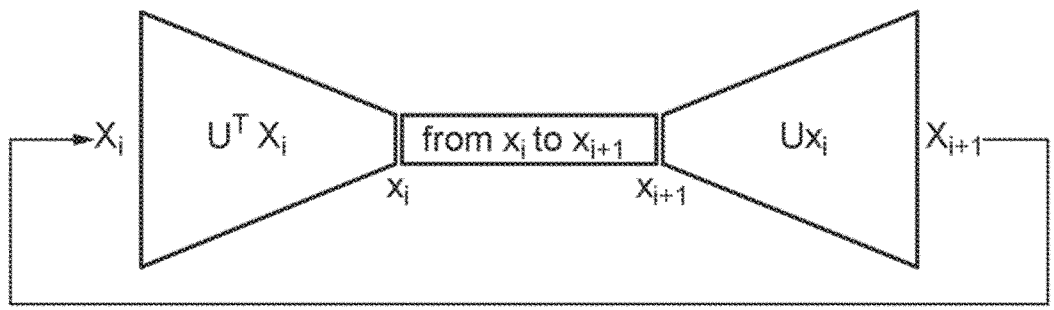
Figure 2:
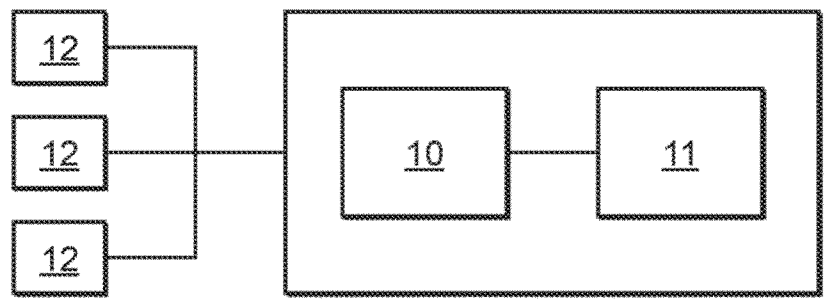
Figure 3:
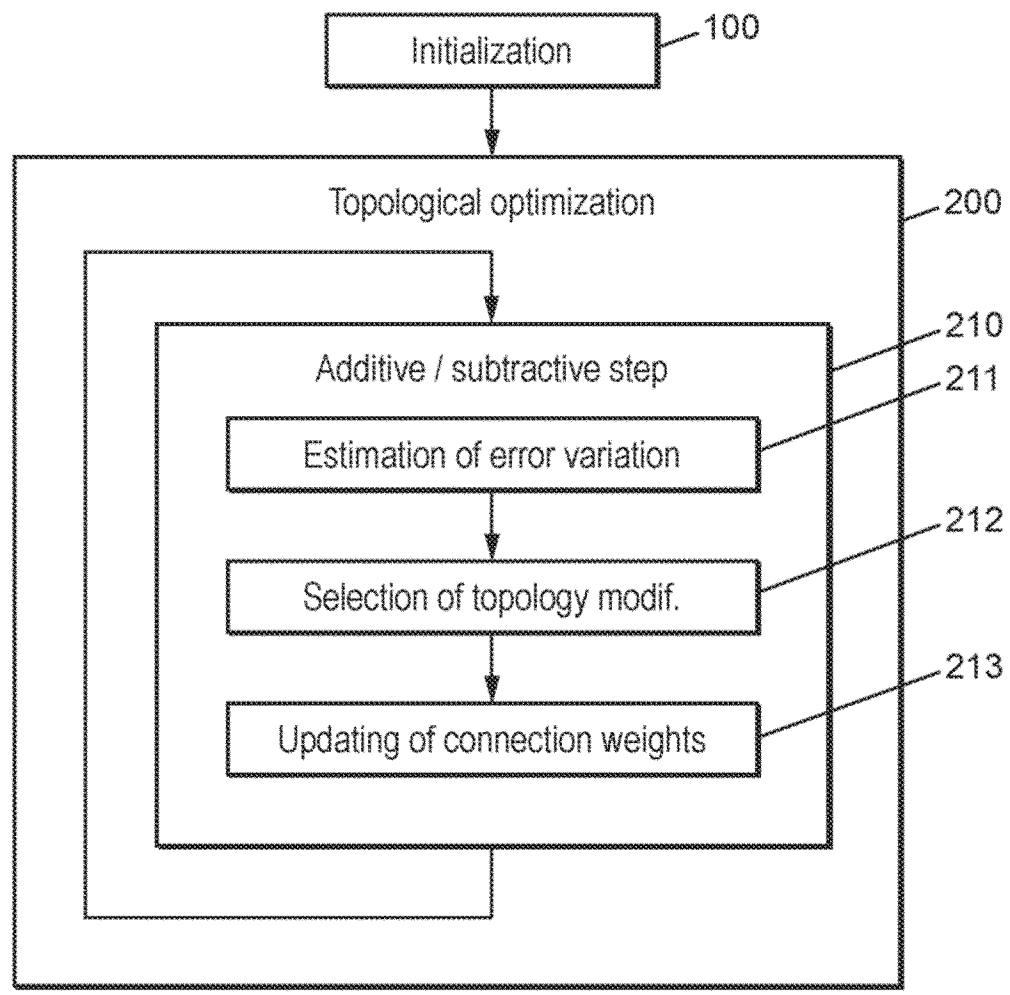
Figure 4A:
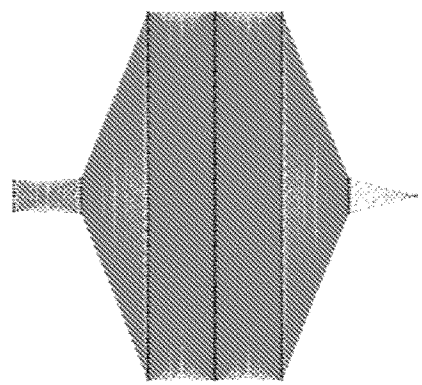
Figure 4B:
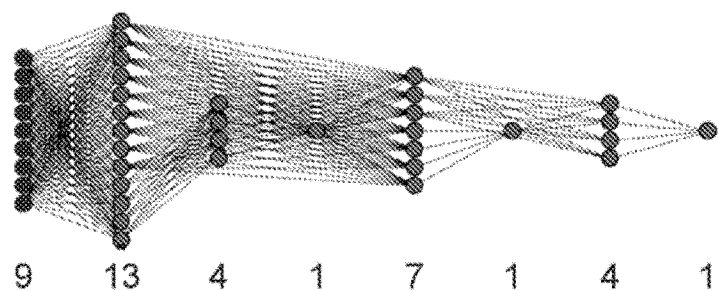
Figure 4C:
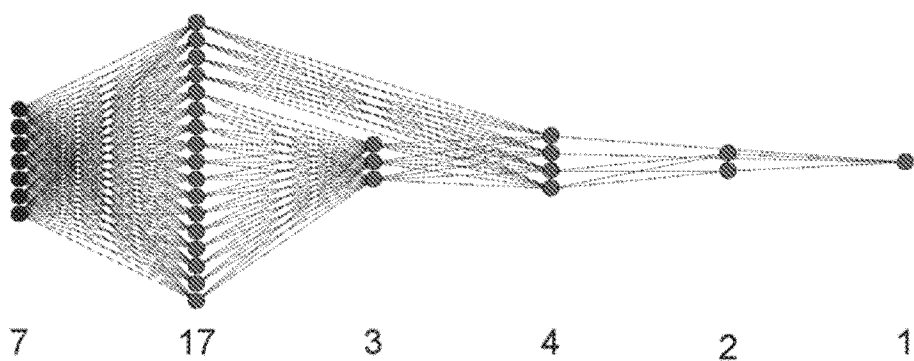
Figure 5:
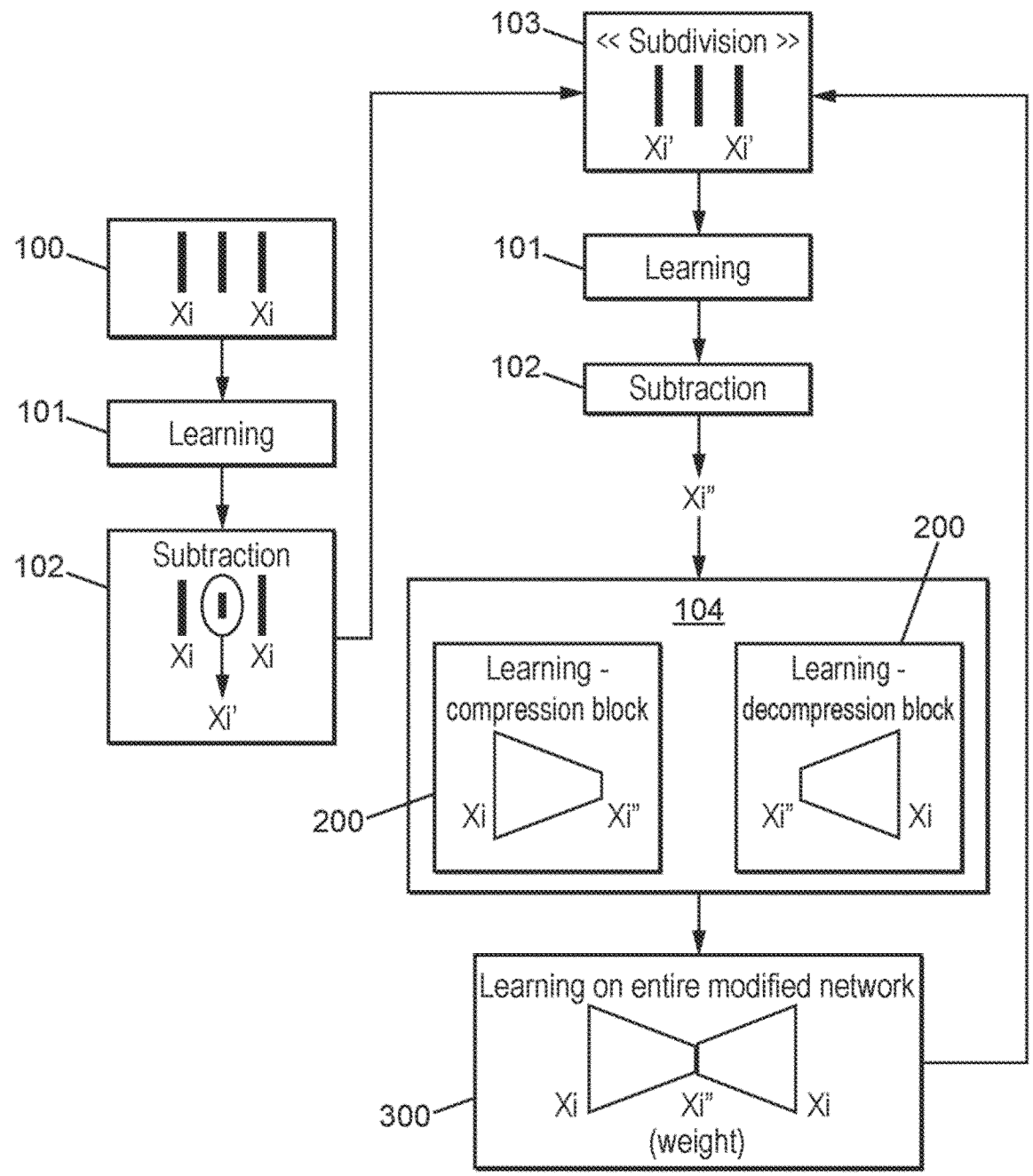
Figure 6A:
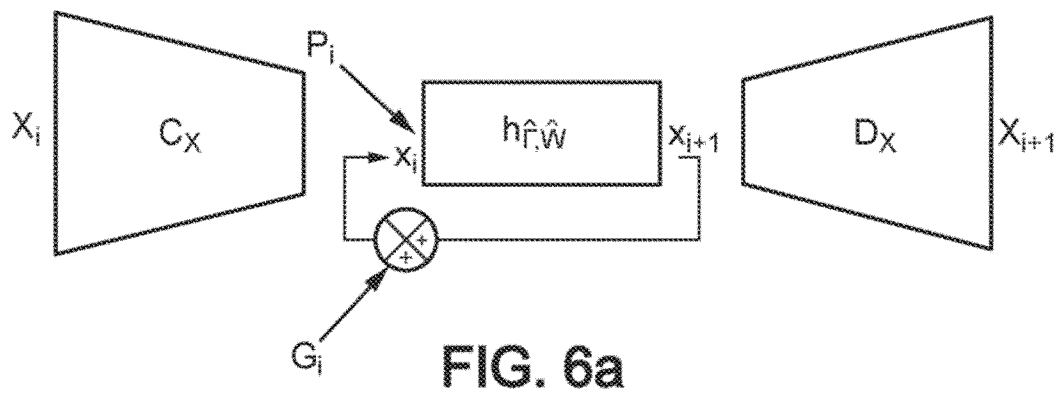
Figure 6B:
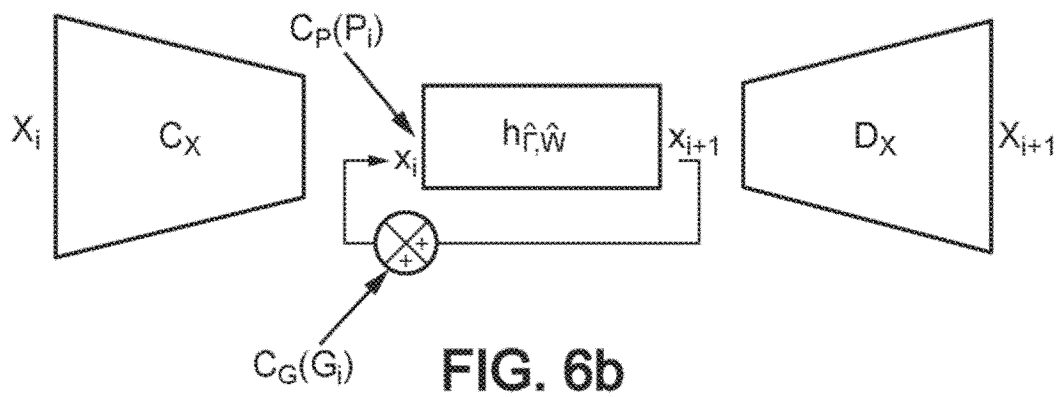
Figure 7A:
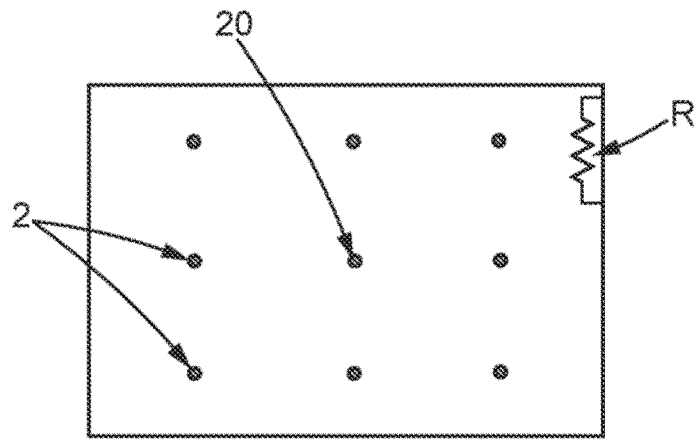
Figure 7B:
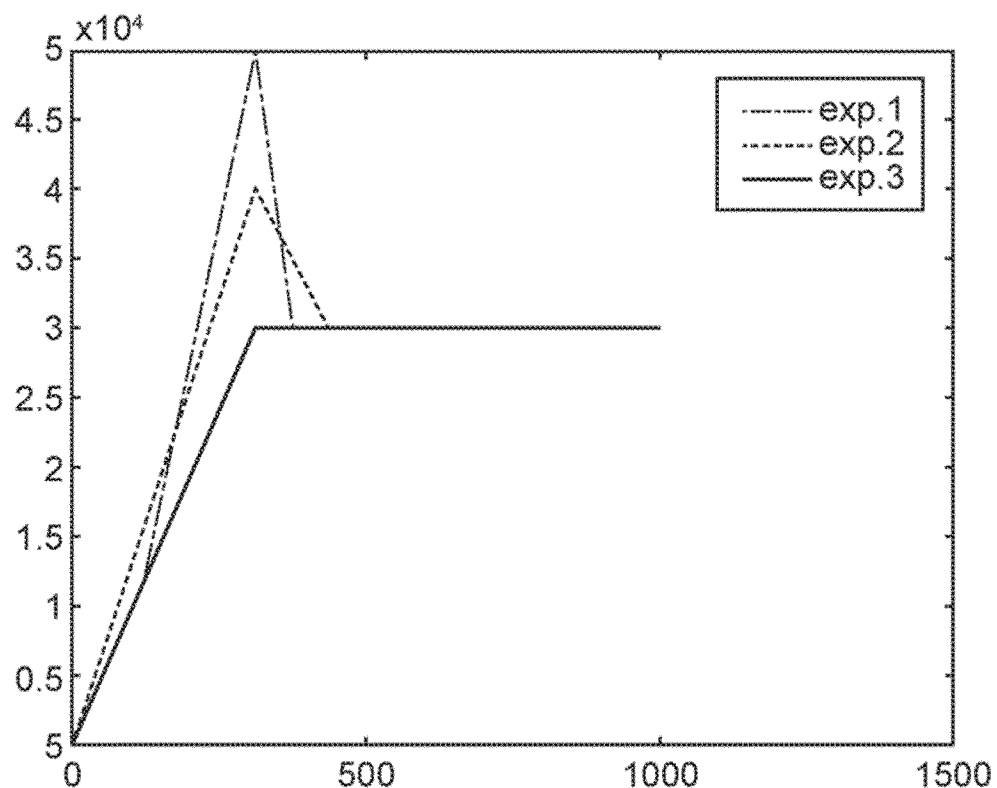
Figure 8A:
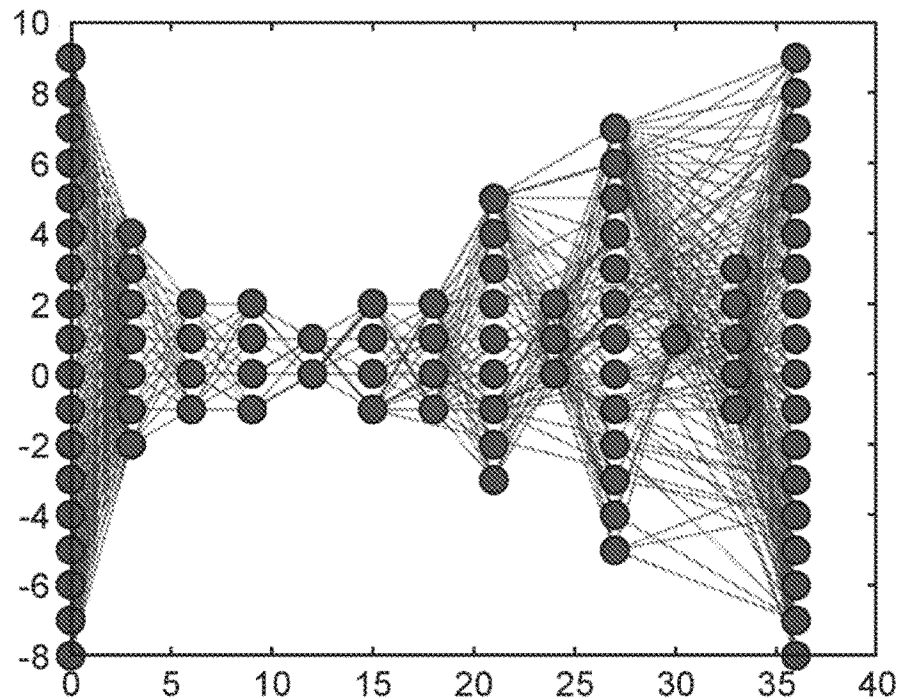
Figure 8B:
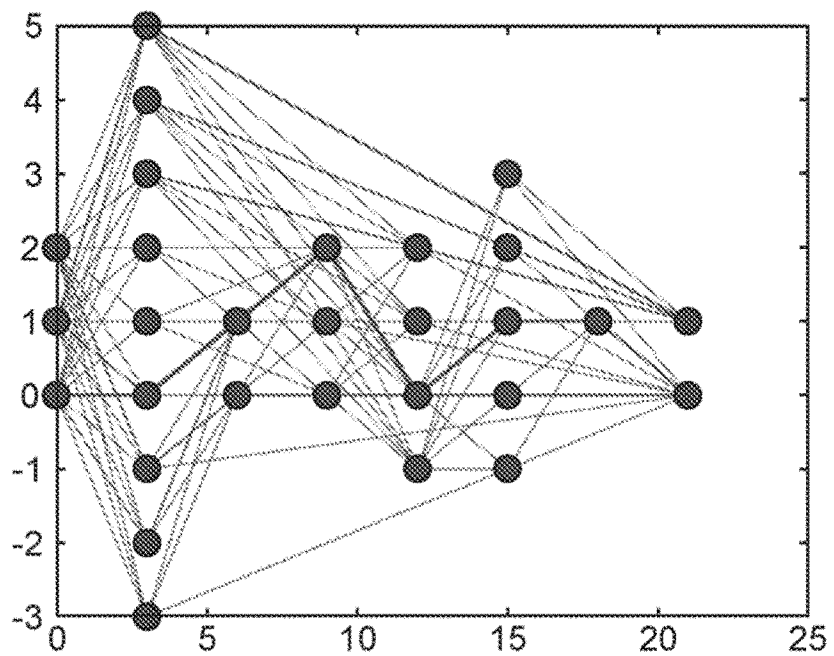
Figure 9A:
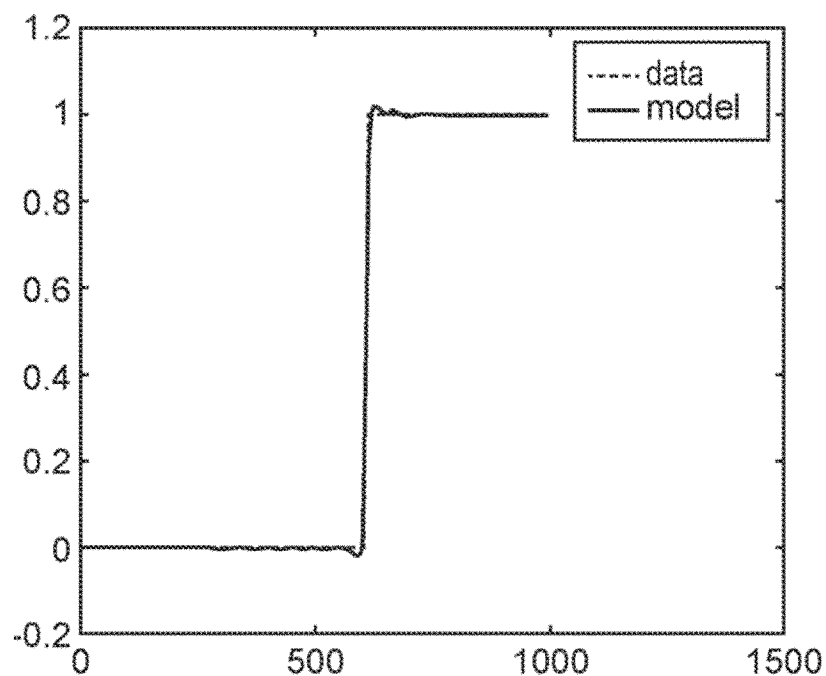
Figure 9B:
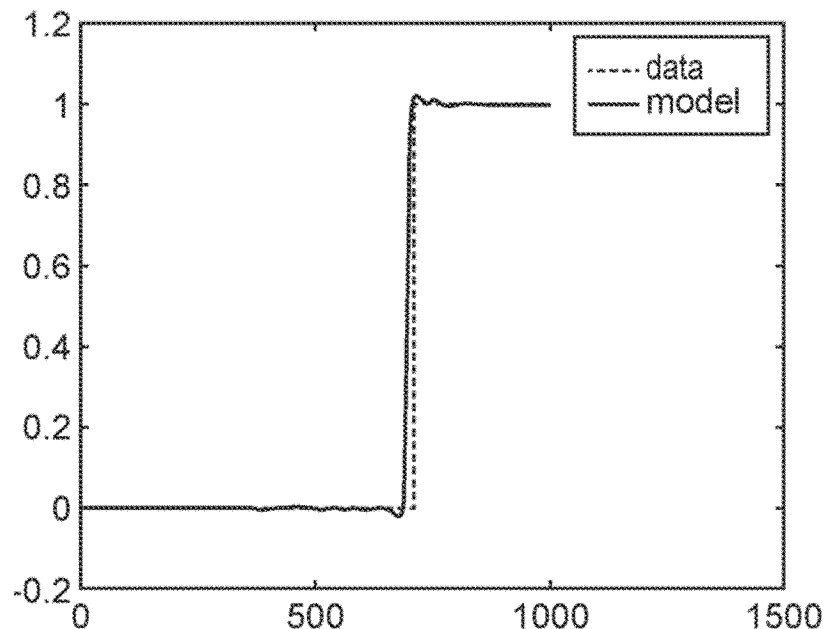
Figure 9C:
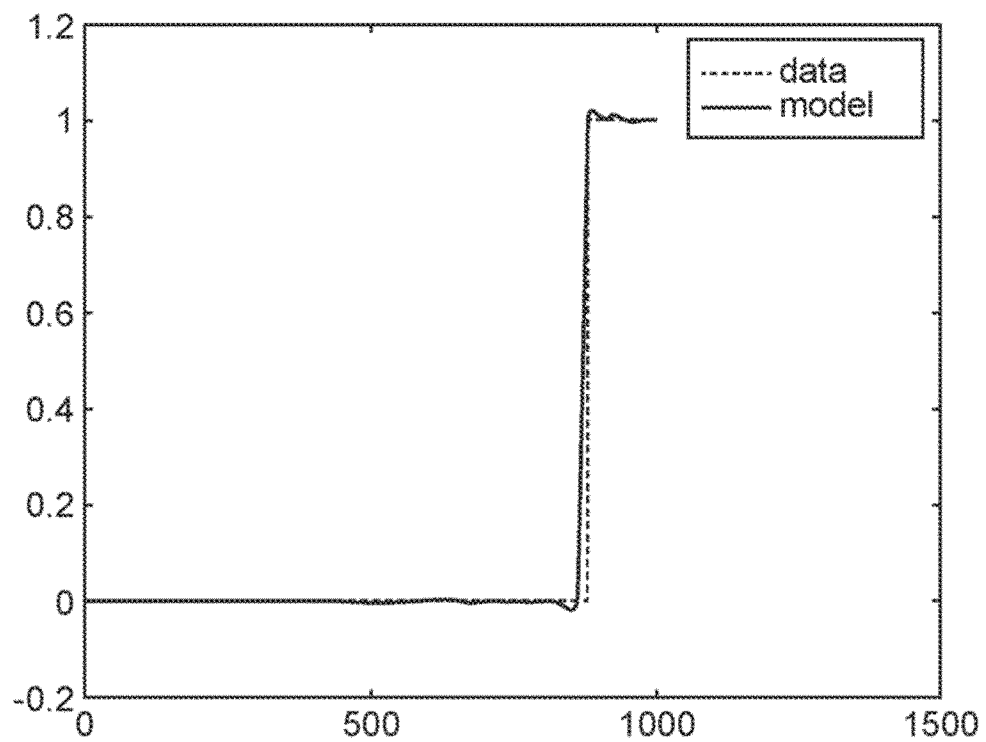

With reference to FIGS. 9a to 9c, a comparison is shown between the real data (data in solid lines) and the prediction data of the model (data in dotted lines) thus constructed, for a central sensor 20 of the container and for each of the three experiments: FIG. 9a corresponds to experiment 1, FIG. 9b corresponds to experiment 2, and FIG. 9c corresponds to experiment 3. On the x-ais is shown the time elapsed in seconds, and on the y-axis is the response of the sensor which we will recall only takes the values of 0 for solid sodium and 1 for liquid sodium.

We will notice from these figures that the position of the sodium melting front depends significantly on the excitation, and that the constructed model succeeds in predicting this position in the validation cases, which are those of FIGS. 9b and 9c.

APPENDIX

The derivative of the sum being equal to the sum of the derivatives, we establish the result for a single training datum: M1=1.

$$\mathcal{L}(\Gamma, W, X, \Lambda) = \|OX^{nc} - Y\|^2 + \sum_{i=1}^{nc} \Lambda_i^T(X^i - f_{SI}(W_{i-1} * X^{i-1}))$$

$$\partial_{X^i} \mathcal{L}(\Gamma, W, X, \Lambda).\phi = 0 \quad \forall \phi.$$

This gives, for i=nc: 2(O $X^{nc}$−Y,O φ)+tr($\Lambda_{nc}^T$φ), ∀φ,

Here (.,.) indicates the scalar product in $\Re^{no}$.

It follows that $\Lambda_{nc}$=2(O $X^{nc}$−Y)$^T$O.

And we obtain for i=nc−1, nc−2, . . . , 0 $\Lambda_i^T\phi - \Sigma_{j>i}\Lambda_j^T$ ($f_{SI}'(W_{j-1}^I * X^i).*(W_{j-1}^I * \phi))=0$, ∀φ, where $W_j^i$ represents the submatrix of $W_j$ which acts on the components of $X^i$. The notation.* designates the product, component by component, of two matrices of the same size.

By having Φ pass through the elements of the canonical basis of $\Re^{n_i}$, we obtain $\Lambda_i^T = \Sigma_{j>i}\Gamma_j^T(f_{SI}'(W_{j-1}^I * X^i) * u).* W_{j-1}^I)$, where u=(1, 1, . . . , 1) is a line vector having $n_i$ elements. By applying a transposition, we obtain: $\Lambda_i = \Sigma_{j>i}(u^T f_{SI}'(W_{j-1}^I * X^i)^T.*(W_{j-1}^I)\Lambda_j$, for i=nc−1, . . . , 0.

Which can also be written in the form $\Lambda_i = \Sigma_{j>i}(\text{diag}(f_{SI}'(W_{j-1}^I * X^i))*(W_{j-1}^I)^T)\Lambda_j$, for i=nc−1, . . . , 0, where diag(x) designates the diagonal matrix in which the diagonal terms are formed by the elements of vector x.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of construction of a feedforward neural network, the method comprising:
   initializing a neural network according to an initial network topology comprising an input layer, at least one hidden layer comprising at least one node, and a set of output nodes, each layer being defined by a set of simultaneously calculable nodes; and
   implementing at least one topological optimization phase of the neural network, wherein each topological optimization phase comprises:
      at least one additive phase, comprising a modification of the network topology by adding at least one node and/or a connection link between an input of a node of a layer and an output of a node of any preceding layer; and/or
      at least one subtractive phase comprising a modification of the network topology by removing at least one node and/or a connection link between nodes of two layers,
   wherein each modification of the network topology during an additive or subtractive phase comprises:
   for a plurality of candidate modifications of the network topology, estimating a variation between:
      a network error for a current topology, and
      a network error for a candidate modified topology, the candidate modified topology being a topology resulting from a candidate modification applied to the current topology, and
   selecting a modification of the network topology among the plurality of candidate modifications, based on the estimated variations of the network error.

2. The method of construction according to claim 1, wherein the selected modification of the network topology is the candidate modification, among the plurality of candidate modifications, which optimizes the variation between the network error for the current topology and the network error for the modified topology,
   and wherein the network error for a given topology is defined by J(Γ, W*), where:
      J is an error function between outputs of the neural network and a target result;
      Γ is the topology of the neural network; and
      W* is a matrix of connection weights of the neural network, minimizing the error function J at a fixed topology Γ.

3. The method of construction according to claim 1, wherein estimating a variation of the network error comprises estimating the network error for the candidate modified topology based on a Lagrange operator applied to connection weights of the neural network $\mathcal{L}(Γ, W, X, Λ)$, where:
   L is the Lagrange operator;
   Γ is the topology of the neural network;
   W is a matrix of connection weights of the neural network;
   $X=(X^0, \ldots, X^{nc})$ represents outputs of all the nodes of the neural network and $X^i$ represents outputs of the cells of layer i; and
   $Λ_i$ is a Lagrange multiplier associated with an expression defining elements of layer $X^i$.

4. The method of construction according to claim 3, wherein, during an additive phase, the variation of the network error between the candidate modified topology and the current topology is estimated by calculating a quantity:

$$\mathcal{L}(Γ^n, W^n, X, Λ) - J(Γ^{n-1}, W^{n-1*})$$

where:
   $Λ^n$ is the topology of the candidate modified topology in iteration n;
   J is an error function between outputs of the neural network and a target result;
   $W^{n-1*}$ is a matrix of connection weights of the neural network for the candidate modified topology of iteration n−1 minimizing the error function J for a fixed topography; and
   $W^n$ is a matrix of connection weights of the neural network after implementing the candidate modified topology in iteration n, said matrix being initialized with the same connection weights as matrix $W^{n-1*}$ for connections that are common to the candidate modified topology at iteration n and the candidate modified topology of iteration n−1, and a connection weight of zero for each link created during the additive phase, then updating by minimization of $\mathcal{R}$ with respect to the weights of the links created.

5. The method of construction according to claim 4 wherein, during a subtractive phase, the variation of the network error between the candidate modified topology and the current topology is estimated by calculating a quantity:

$$\mathcal{L}(Γ^n, W^n, X, Λ) - J(Γ^{n-1}, W^{n-1*})$$

where $W^n = W_{|Γ^n}^{n-1*}$ is a restriction of $W^{n-1*}$ to topology $Γ^n$.

6. The method of construction according to claim 1, wherein the neural network is adapted to simulate a physical system governed by an equation of the type Y=f(X) where X is an input datum and Y is a response of the physical system, and an error J of the neural network is defined as a function of the topology Γ and of the matrix W of connection weights of the neural network, by:

$$J(Γ, W) = \sum_{i=1}^{M} \|f_{Γ,W}(X_i) - Y_i\|^2$$

where $f_{Γ,W}(X_i)$ is the output of the neural network, and $X_i$ and $Y_i$ are respectively input and output data generated by measurements on the physical system.

7. The method of construction according to claim 1, comprising, once the modification of the network topology has been selected, determining a matrix of connection weights of the neural network by a method of descending an error with respect to said matrix.

8. The method of construction according to claim 1, wherein the topological optimization phase is implemented as a function of mean errors of the neural network on training data on one hand, and on validation data on the other hand, wherein:
   at least one additive step is implemented to reduce an average network error on the training data;
   at least one subtractive step is implemented, if the network error on the training data becomes less than the network error on the validation data beyond a predetermined tolerance; and
   the topological optimization phase is stopped when no additive or subtractive step results in a reduction of the network error on the training data and on the validation data.

9. The method of construction according to claim 1, wherein the neural network comprises at least one compression block suitable for generating compressed data, and a decompression block, the method comprising at least one topological optimization phase implemented respectively on the compression block and on the decompression block, and further comprising, after topological optimization of the compression and decompression blocks, implementing a learning phase on the neural network as a whole at a fixed topology.

10. The method of construction according to claim 9, further comprising selecting of the compression block and the decompression block;
   adding a modeling block, respectively as output from the compression block or as input to the decompression block, wherein at least one topological optimization phase is implemented on the modeling block; and
   implementing a learning phase at a fixed topology on the modeling block and the compression or decompression block.

11. The method of construction according to claim 9, further comprising inserting, between the compression block and the decompression block, a modeling block suitable for modeling an evolution of a dynamic system governed by an equation of the form $$X_{i+1}=F(X_i,P_i)+G_i, \ i\geq 0$$

where $X_i$ is a measurable characteristic of a physical system at a given time, $P_i$ describes an internal state of the physical system, and $G_i$ describes an excitation,
   and the modeling block is suitable for calculating an output $x_{i+1}$ of the form:

$$x_{i+1}=h_{\hat{\Gamma},\hat{W}}(x_i,p_i)+g_i, \ i\geq 0$$

$$x_0=C_X(X_0)) \quad (17)$$

where:
   $x_i$ is a compression of $X_i$ by the compression block $x_i=C_X(X_i)$;
   $h_{\hat{\Gamma},\hat{W}}$ is a function calculated by the modeling block, $\hat{\Gamma}$ and $\hat{W}$ are respectively a topology and a matrix of connection weights of the modeling block; and
   $p_i$ and $g_i$ are data representative of the excitation and of the internal state of the physical system on which the modeling block is implemented.

12. A neural network, wherein the neural network is obtained by implementing the method according to claim 1.

13. A non-transitory computer-readable medium containing code instructions for implementing the method according to claim 1, when the code instructions are executed by a processor.

14. A method of simulation of a physical system governed by an equation of type Y=f(X) where X is an input datum and Y is a response of the physical system, the method comprising:
   constructing of a neural network suitable for calculating a function $f_{\hat{\Gamma},\hat{W}}$ such that $Y\approx f_{\hat{\Gamma},\hat{W}}(X)$, by implementing the method according to claim 1; and
   applying the neural network to a new input datum $X_j$ representative of a physical quantity of the physical system, in order to deduce therefrom a simulation of response $Y_j$ of the physical system.

15. The method of simulation according to claim 14, wherein the neural network further comprises a data compression block, the method comprising implementing the at least one topoligical optimization phase on the data compression block.

16. A method of data compression, comprising:
   constructing a neural network comprising a compression block receiving a datum X as input and a decompression block generating the datum X as output;
   the neural network comprising processing nodes and connections between the processing nodes forming a topology organized in layers, such that each layer is defined by a set of simultaneously calculable processing nodes, and an input of a processing node of a layer is connectable to an output of a processing node of any previously calculated layer;
   wherein constructing the neural network includes initializing the neural network according to an initial topology comprising an input layer, at least one hidden layer comprising at least one node, and a set of output nodes, and implementing at least one topological optimization phase on the compression block and the decompression block, each topological optimization phase comprising:
      at least one additive phase comprising a modification of the network topology by adding at least one processing node and/or a connection link between the input of a processing node of a layer and the output of a processing node of any layer; and/or
      at least one subtractive phase comprising a modification of the network topology by removing at least one processing node and/or removing a connection link between processing nodes of two layers,
      wherein each topology modification comprises a selection of a topology modification among several candidate modifications, based on an estimation of the variation in the network error, calculated on training data, between a previous topology and each topology modified according to a candidate modification and
   applying the compression block of the constructed network to at least one datum representative of the state of a physical system.

* * * * *

UNITED STATES PATENT AND TRADEMARK OFFICE
CERTIFICATE OF CORRECTION

| | | |
|---|---|---|
| PATENT NO. | : 12,124,779 B2 | Page 1 of 11 |
| APPLICATION NO. | : 17/292305 | |
| DATED | : October 22, 2024 | |
| INVENTOR(S) | : Manuel Bompard et al. | |

It is certified that error appears in the above-identified patent and that said Letters Patent is hereby corrected as shown below:

On the Title Page

Replace the illustrative print figure, Figure 4a, as shown on the attached drawing sheet 3 of 9.

In the Drawings

Delete drawing pages 1-9, and insert the following corrected Figures 1-9c as shown on the attached drawing pages 1-9.

In the Claims

Column 23, Claim 1, Line 18:
"subtractive phase comprising" should read: --subtractive phase, comprising--.

Column 24, Claim 4, Line 1:
"$\Lambda^n$" should read: --$\Gamma^n$--.

Column 24, Claim 4, Line 18:
"$\mathfrak{R}$" should read: --$\mathcal{L}$--.

Column 25, Claim 10, Line 6:
"selecting of the compression" should read: --selecting the compression--.

Column 26, Claim 14, Line 1:
"constructing of a neural network" should read: --constructing a neural network--.

Column 26, Claim 15, Line 11:
"one topoligical optimization" should read: --one topological optimization--.

Signed and Sealed this
Twenty-second Day of April, 2025

Coke Morgan Stewart
*Acting Director of the United States Patent and Trademark Office*

Column 26, Claim 16, Line 34:
"of any layer; and/or" should read: --of any preceding layer; and/or--.

Column 26, Claim 16, Line 44:
"candidate modification and" should read: --candidate modification; and--.